US010488671B2

(12) United States Patent
Tanaka et al.

(10) Patent No.: US 10,488,671 B2
(45) Date of Patent: Nov. 26, 2019

(54) METHOD OF LASER IRRADIATION, LASER IRRADIATION APPARATUS, AND METHOD OF MANUFACTURING A SEMICONDUCTOR DEVICE

(71) Applicant: SEMICONDUCTOR ENERGY LABORATORY CO., LTD., Atsugi-shi, Kanagawa-ken (JP)

(72) Inventors: Koichiro Tanaka, Kanagawa (JP); Tomoaki Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/911,409

(22) Filed: Mar. 5, 2018

(65) Prior Publication Data

US 2018/0188546 A1    Jul. 5, 2018

Related U.S. Application Data

(60) Division of application No. 15/424,316, filed on Feb. 3, 2017, now Pat. No. 9,910,285, which is a (Continued)

(30) Foreign Application Priority Data

Aug. 27, 2001 (JP) .................... 2001-256130

(51) Int. Cl.
*G02B 27/09* (2006.01)
*H01S 3/00* (2006.01)
(Continued)

(52) U.S. Cl.
CPC .......... *G02B 27/0955* (2013.01); *B23K 26/06* (2013.01); *B23K 26/064* (2015.10); (Continued)

(58) Field of Classification Search
CPC ............ G02B 27/09; H01S 3/00; H01L 21/26 (Continued)

(56) References Cited

U.S. PATENT DOCUMENTS 3,914,011 A    10/1975   Mallinson et al.
4,378,480 A     3/1983   Langhans
(Continued)

FOREIGN PATENT DOCUMENTS

EP    0660169 A    6/1995
EP    1076359 A    2/2001
(Continued)

OTHER PUBLICATIONS

Office Action (Application No. 2001-256130) dated Mar. 27, 2007. Hellma Optik Gmbh Jena.

*Primary Examiner* — Samuel M Heinrich
(74) *Attorney, Agent, or Firm* — Nixon Peabody LLP; Jeffrey L. Costellia

(57) ABSTRACT

If an optical path length of an optical system is reduced and a length of a laser light on an irradiation surface is increased, there occurs curvature of field which is a phenomenon that a convergent position deviates depending on an incident angle or incident position of a laser light with respect to a lens. To avoid this phenomenon, an optical element having a negative power such as a concave lens or a concave cylindrical lens is inserted to regulate the optical path length of the laser light and a convergent position is made coincident with a irradiation surface to form an image on the irradiation surface.

12 Claims, 29 Drawing Sheets

Related U.S. Application Data continuation of application No. 14/248,425, filed on Apr. 9, 2014, now Pat. No. 9,564,323, which is a continuation of application No. 13/962,984, filed on Aug. 9, 2013, now Pat. No. 8,722,521, which is a continuation of application No. 10/227,296, filed on Aug. 26, 2002, now Pat. No. 8,507,334.

(51) Int. Cl.

| | | |
|---|---|---|
| *H01L 21/268* | (2006.01) | |
| *B23K 26/064* | (2014.01) | |
| *B23K 26/06* | (2014.01) | |
| *H01L 21/02* | (2006.01) | |
| *B23K 26/073* | (2006.01) | |
| *H01L 33/08* | (2010.01) | |
| *H01L 21/28* | (2006.01) | |
| *H01L 21/20* | (2006.01) | |
| *H01L 27/32* | (2006.01) | |
| *H01L 51/52* | (2006.01) | |
| *H01S 5/40* | (2006.01) | |
| *H01L 27/12* | (2006.01) | |

(52) U.S. Cl.
CPC ...... *B23K 26/0604* (2013.01); *B23K 26/0732* (2013.01); *B23K 26/0736* (2013.01); *B23K 26/0738* (2013.01); *G02B 27/09* (2013.01); *G02B 27/095* (2013.01); *H01L 21/02422* (2013.01); *H01L 21/02532* (2013.01); *H01L 21/02678* (2013.01); *H01L 21/02683* (2013.01); *H01L 21/02686* (2013.01); *H01L 21/268* (2013.01); *H01L 21/28017* (2013.01); *H01L 33/08* (2013.01); *H01S 3/005* (2013.01); *H01L 21/2026* (2013.01); *H01L 27/1285* (2013.01); *H01L 27/3244* (2013.01); *H01L 27/3295* (2013.01); *H01L 51/5237* (2013.01); *H01L 51/5246* (2013.01); *H01S 5/4012* (2013.01); *H01S 5/4025* (2013.01)

(58) Field of Classification Search
USPC .......................................... 219/121.6–121.86
See application file for complete search history.

(56) References Cited

U.S. PATENT DOCUMENTS

| | | |
|---|---|---|
| 4,469,527 A | 9/1984 | Sugano et al. |
| 4,475,027 A | 10/1984 | Pressley |
| 5,041,862 A | 8/1991 | Rossman et al. |
| 5,093,745 A | 3/1992 | Kuroda |
| 5,172,132 A | 12/1992 | Haneda et al. |
| 5,233,454 A | 8/1993 | Sakuma et al. |
| 5,414,559 A | 5/1995 | Burghardt et al. |
| 5,478,398 A | 12/1995 | Nakanishi et al. |
| 5,627,678 A | 5/1997 | Nishii et al. |
| 5,677,755 A | 10/1997 | Oshida et al. |
| 5,721,416 A | 2/1998 | Burghardt et al. |
| 5,756,364 A | 5/1998 | Tanaka et al. |
| 5,795,795 A | 8/1998 | Kousai et al. |
| 5,796,521 A | 8/1998 | Kahlert et al. |
| 5,815,494 A | 9/1998 | Yamazaki et al. |
| 5,854,803 A | 12/1998 | Yamazaki et al. |
| 5,858,822 A | 1/1999 | Yamazaki et al. |
| 5,900,980 A | 5/1999 | Yamazaki et al. |
| 5,907,770 A | 5/1999 | Yamazaki et al. |
| 5,936,218 A | 8/1999 | Ohkawa et al. |
| 6,002,523 A | 12/1999 | Tanaka |
| 6,040,929 A | 3/2000 | Hasegawa et al. |
| 6,054,739 A | 4/2000 | Yamazaki et al. |
| 6,059,873 A | 5/2000 | Yamaguchi et al. |
| 6,067,182 A | 5/2000 | Narisawa |
| 6,104,535 A | 8/2000 | Tanaka |
| 6,136,632 A | 10/2000 | Higashi |
| 6,137,633 A | 10/2000 | Tanaka |
| 6,157,492 A | 12/2000 | Yamazaki et al. |
| 6,160,827 A | 12/2000 | Tanaka |
| 6,165,876 A | 12/2000 | Yamazaki et al. |
| 6,169,014 B1 | 1/2001 | McCulloch |
| 6,176,926 B1 | 1/2001 | Tanaka |
| 6,212,012 B1 | 4/2001 | Tanaka |
| 6,215,595 B1 | 4/2001 | Yamazaki et al. |
| 6,219,113 B1 | 4/2001 | Takahara |
| 6,243,206 B1 | 6/2001 | Wangler |
| 6,249,385 B1 | 6/2001 | Yamazaki et al. |
| 6,262,793 B1 | 7/2001 | Sasaya et al. |
| 6,300,176 B1 | 10/2001 | Zhang et al. |
| 6,353,218 B1 | 3/2002 | Yamazaki et al. |
| 6,353,244 B1 | 3/2002 | Yamazaki et al. |
| 6,388,812 B2 | 5/2002 | Yamazaki et al. |
| 6,392,810 B1 | 5/2002 | Tanaka |
| 6,393,042 B1 | 5/2002 | Tanaka |
| 6,437,284 B1 | 8/2002 | Okamoto et al. |
| 6,437,313 B2 | 8/2002 | Yamazaki et al. |
| 6,441,965 B2 | 8/2002 | Yamazaki et al. |
| 6,452,132 B1 | 9/2002 | Fuse |
| 6,524,977 B1 | 2/2003 | Yamazaki et al. |
| 6,567,219 B1 | 5/2003 | Tanaka |
| 6,567,450 B2 | 5/2003 | Myers et al. |
| 6,583,937 B1 | 6/2003 | Wangler et al. |
| 6,587,277 B2 | 7/2003 | Yamazaki et al. |
| 6,593,216 B1 | 7/2003 | Yamazaki et al. |
| 6,596,613 B1 | 7/2003 | Kusumoto et al. |
| 6,618,421 B2 | 9/2003 | Das et al. |
| 6,621,639 B2 | 9/2003 | Kahlert et al. |
| 6,625,191 B2 | 9/2003 | Knowles et al. |
| 6,639,728 B2 * | 10/2003 | Murra ................ B23K 26/0604 359/622 |
| 6,704,339 B2 | 3/2004 | Lublin et al. |
| 6,730,550 B1 | 5/2004 | Yamazaki et al. |
| 6,750,423 B2 | 6/2004 | Tanaka et al. |
| 6,787,755 B2 | 9/2004 | Yamazaki et al. |
| 6,818,568 B2 | 11/2004 | Tanaka |
| 6,861,614 B1 | 3/2005 | Tanabe et al. |
| 6,894,839 B2 | 5/2005 | Sugiyama et al. |
| 6,958,803 B2 | 10/2005 | Sasaya et al. |
| 6,961,184 B2 | 11/2005 | Yamazaki et al. |
| 6,989,524 B2 | 1/2006 | Yamazaki et al. |
| 7,061,959 B2 | 6/2006 | Partlo et al. |
| 7,071,035 B2 | 7/2006 | Yamazaki et al. |
| 7,129,124 B2 | 10/2006 | Hongo et al. |
| 7,371,620 B2 | 5/2008 | Yamazaki et al. |
| 7,749,818 B2 | 7/2010 | Isobe et al. |
| 8,993,421 B2 | 3/2015 | Tanaka et al. |
| 9,087,696 B2 | 7/2015 | Im et al. |
| 2002/0008091 A1 | 1/2002 | Brandinger et al. |
| 2002/0054282 A1 | 5/2002 | Sasaya et al. |
| 2003/0010889 A1 | 1/2003 | Igasaki et al. |
| 2003/0053393 A1 | 3/2003 | Shimano et al. |
| 2004/0016967 A1 | 1/2004 | Yamazaki et al. |
| 2004/0120050 A1 | 6/2004 | Tsukihara et al. |
| 2004/0161913 A1 | 8/2004 | Kawasaki et al. |
| 2005/0169330 A1 | 8/2005 | Hongo et al. |
| 2005/0206041 A1 | 9/2005 | Temple et al. |
| 2006/0068607 A1 | 3/2006 | Yamazaki et al. |

FOREIGN PATENT DOCUMENTS

| | | |
|---|---|---|
| JP | 55-108943 A | 8/1980 |
| JP | 03-062086 A | 3/1991 |
| JP | 03-064727 A | 3/1991 |
| JP | 04-195187 A | 7/1992 |
| JP | 05-342682 A | 12/1993 |
| JP | 07-183190 A | 7/1995 |
| JP | 09-051104 A | 2/1997 |
| JP | 09-057472 A | 3/1997 |
| JP | 09-270393 A | 10/1997 |
| JP | 09-275081 A | 10/1997 |
| JP | 10-312963 A | 11/1998 |
| JP | 10-314970 A | 12/1998 |
| JP | 11-016851 A | 1/1999 |
| JP | 11-186189 A | 7/1999 |

(56) References Cited

FOREIGN PATENT DOCUMENTS

| | | |
|---|---|---|
| JP | 11-194287 A | 7/1999 |
| JP | 11-340160 A | 12/1999 |
| JP | 2000-323428 A | 11/2000 |
| JP | 2001-075043 A | 3/2001 |
| JP | 2001-085703 A | 3/2001 |
| JP | 2001-127003 A | 5/2001 |
| JP | 2001-156016 A | 6/2001 |

\* cited by examiner

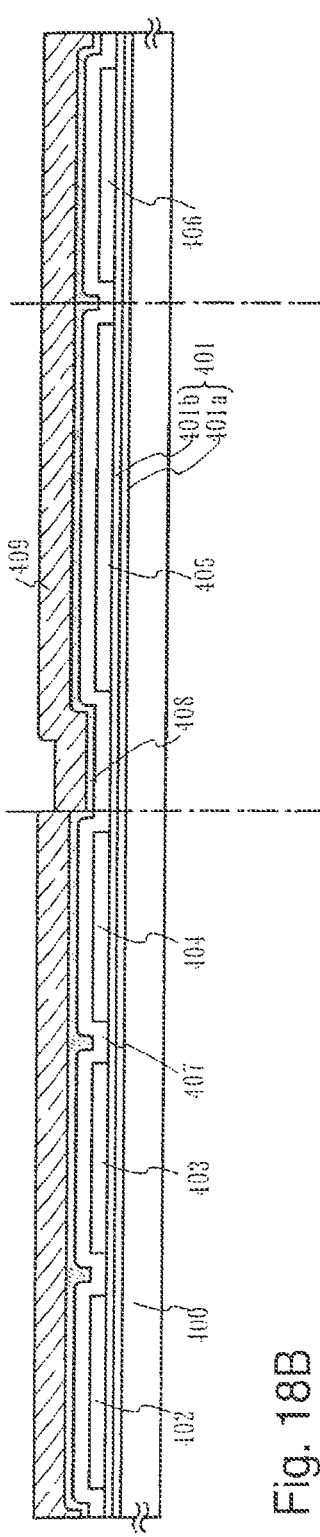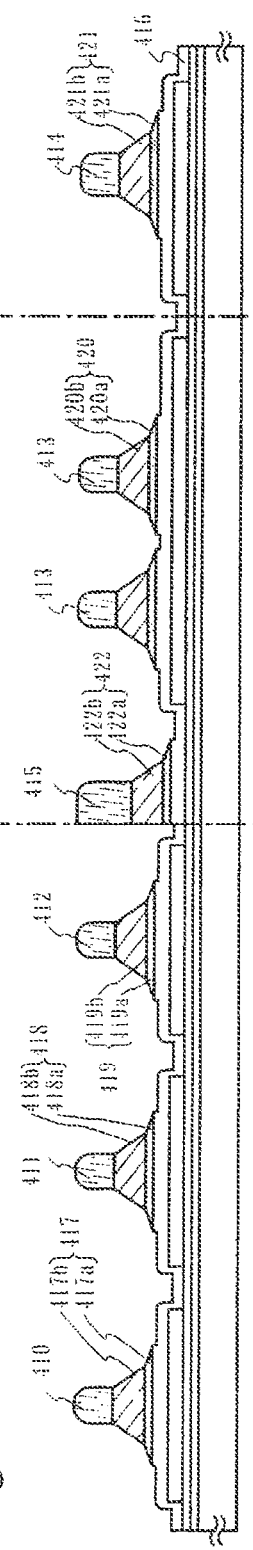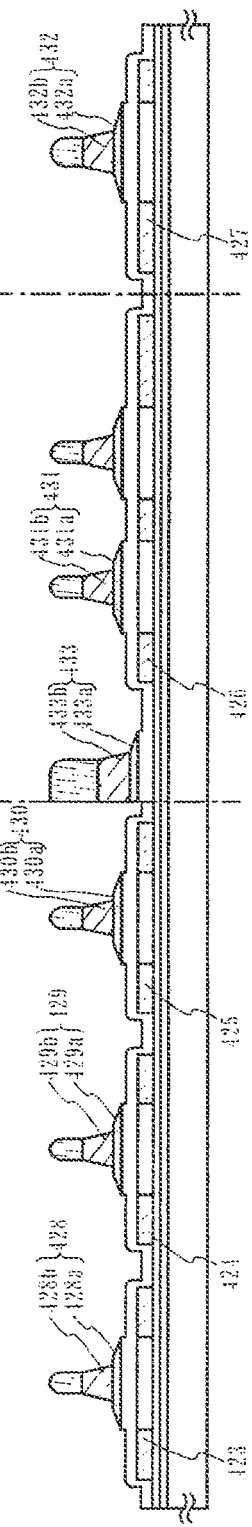

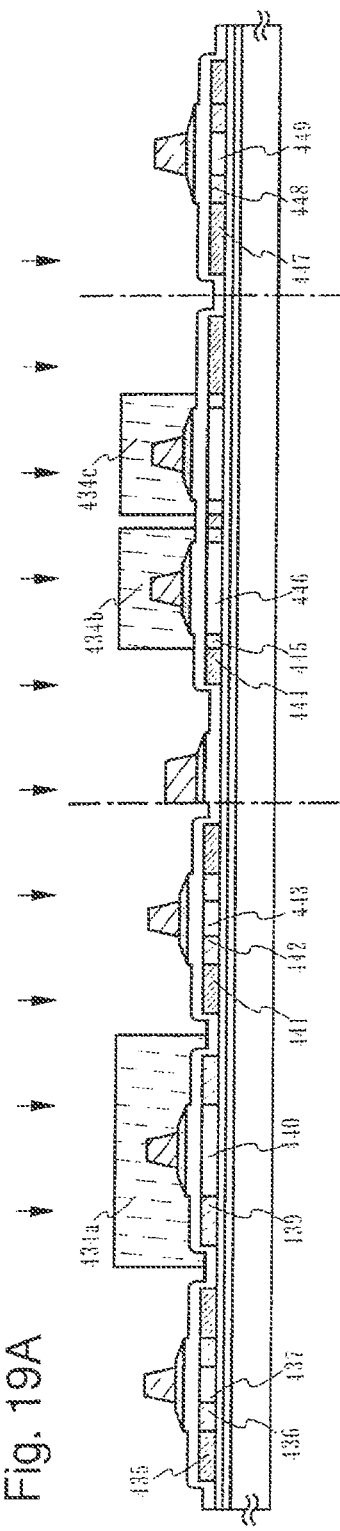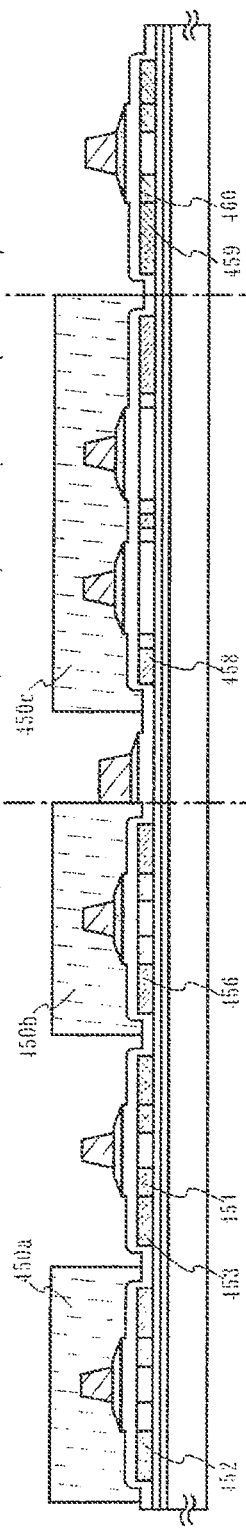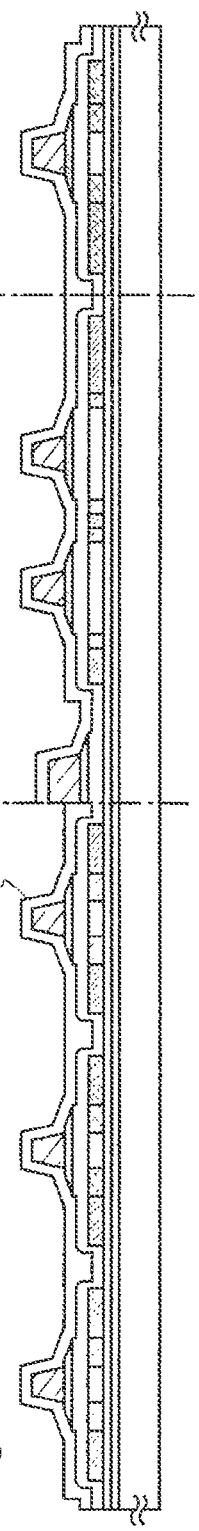

top view side view source driver portion
gate driver portion
pixel portion large area substrate
linear beam
direction of linear beam moving relative to the large area substrate

METHOD OF LASER IRRADIATION, LASER IRRADIATION APPARATUS, AND METHOD OF MANUFACTURING A SEMICONDUCTOR DEVICE

BACKGROUND OF THE INVENTION

1. Field of the Invention

The present invention relates to a laser beam irradiation method and a laser irradiation apparatus for using the method (apparatus including a laser and an optical system for guiding laser beam emitted from the laser to an object to be irradiated). In addition, the present invention relates to a method of manufacturing a semiconductor device, which includes a laser beam irradiation step. Note that a semiconductor device described here includes an electro-optical device such as a liquid crystal display device or a light-emitting device and an electronic device that includes the electro-optical device as a part.

2. Description of the Related Art

In recent years, a wide study has been made on a technique in which laser annealing is performed for a semiconductor film formed on an insulating substrate made of glass or the like, to crystallize the film, to improve its crystallinity so that a crystalline semiconductor film is obtained, or to activate an impurity element. Note that a crystalline semiconductor film in this specification indicates a semiconductor film in which a crystallized region is present, and also includes a semiconductor film that is crystallized as a whole.

A method of forming pulse laser beam from an excimer laser or the like by an optical system such that it becomes a square spot of several cm or a linear shape of 100 mm or more in length on an irradiation surface, and scanning the laser beam (or relatively shifting an irradiation position of the laser beam with respect to the irradiation surface) to conduct annealing is superior in mass productivity and is excellent in technology. The "linear shape" described here means not a "line" in the strict sense but a rectangle (or a prolate ellipsoid shape) having a high aspect ratio. For example, it indicates a shape having an aspect ratio of 10 or more (preferably, 100 to 10000). Note that the linear shape is used to obtain an energy density required for sufficiently annealing an object to be irradiated. Thus, if sufficient annealing is conducted for the object to be irradiated, it may be a rectangular shape.

FIGS. 27A and 27B show an example of a configuration of an optical system for forming laser beam in a linear shape on an irradiation surface. This configuration is extremely general. All optical systems described above are based on the configuration shown in FIGS. 27A and 27B. According to the configuration, a cross sectional shape of laser beam is converted into a linear shape, and simultaneously an energy density distribution of laser beam on the irradiation surface is homogenized. In general, an optical system for homogenizing the energy density distribution of laser beam is called a beam homogenizer.

Laser beam emitted from a laser 101 is divided in a direction perpendicular to an optical axis the laser beam by a cylindrical lens array 103. The direction is called a first direction in this specification. It is assumed that, when a mirror is inserted in a course of an optical system, the first direction is changed in accordance with a direction of light bent by the mirror. In this configuration, the cylindrical lens array is divided into seven parts. Then, the laser beams are superposed on an irradiation surface 109 by a cylindrical lens 104, thereby homogenizing an energy density distribution of the linear laser beam in the longitudinal direction, and the length of the longitudinal direction is determined.

Next, the configuration shown in the side view of FIG. 27B will be described. Laser beam emitted from a laser 101 is divided in a direction perpendicular to an optical axis thereof and the first direction by cylindrical lens arrays 102a and 102b. The direction is called a second direction in this specification. It is assumed that, when a mirror is inserted in a course of an optical system, the second direction is changed in accordance with a direction of light bent by the mirror. In this configuration, the cylindrical lens arrays 102a and 102b each are divided into four parts. The divided laser beams are temporarily synthesized by a cylindrical lens 104. After that, the laser beams are reflected by a mirror 107 and then condensed by a doublet cylindrical lens 108 so that they become again single laser beam on the irradiation surface 109. The doublet cylindrical lens 108 is a lens composed of two cylindrical lenses. Thus, an energy density distribution of the linear laser beam in a width direction is homogenized, thereby homogenizing an energy density distribution of the linear laser beam in the longitudinal direction, and the length of the width direction is determined.

For example, an excimer laser in which a size in a laser window is 10 mm×30 mm (which each are a half-width in beam profile) is used as the laser 101 and laser beam is produced by the optical system having the configuration shown in FIGS. 27A and 27B. Then, linear laser beam which has a uniform energy density distribution and a size of 125 mm×0.4 mm can be obtained on the irradiation surface 109.

At this time, when, for example, quartz is used for all base materials of the optical system, high transmittance is obtained. Note that coating is preferably conducted for the optical system such that transmittance of 99% or more is obtained at a frequency of the used excimer laser.

Then, the linear laser beam formed by the above configuration is irradiated with an overlap state while being gradually shifted in a width direction thereof. Thus, when laser annealing is performed for the entire surface of an amorphous semiconductor film, the amorphous semiconductor film can be crystallized, crystallinity can be improved to obtain a crystalline semiconductor film, or an impurity element can be activated.

In addition, an area of a substrate used for manufacturing a semiconductor device is being increased more and more. This is because high throughput and a low cost can be realized in the case where a plurality of semiconductor devices such as liquid crystal display device panels are manufactured from a single large area substrate as compared with, for example, the case where a semiconductor device such as liquid crystal display device panel is manufactured from a single substrate. At the present time, for example, a substrate of 600 mm×720 mm, a circular substrate of 12 inches (about 300 mm in diameter), etc. are used as the large area substrate. Further, it is expected that a substrate in which a length of one side exceeds 1000 mm will be also used in future.

However, in the optical system forming a linear beam that is longer than the prior art, for example, 300 mm, in the length direction, the optical path length thereof is as long as 5,000 mm. It is extremely difficult and requires a large footprint to perform optical adjustment of the optical system with such a long optical path length, thereby causing a problem in that the apparatus becomes larger.

Now, a part of the optical system is changed, for example, a lens with a short focal distance is substituted for the lens that is used to change the distance between the lenses, and the optical path length of the optical system forming the linear beam of 300 mm in the length direction, is set to, for example, 2,400 mm. However, in the linear beam formed by the optical system, a convergent position deviates at both ends of the irradiation surface in the length direction.

Here, the description will be made of the cause that the convergent position deviates at both ends of the irradiation surface in the length direction by making the optical path length short. The optical path length of light incident obliquely upon the lens is longer than that of light incident perpendicularly thereupon. Also, as the incident angle of the obliquely incident light is larger, the optical path difference from the perpendicularly incident light is larger. The difference of the optical path length depending on the incident position or incident angle becomes deviation of the convergent position. Accordingly, in the irradiation surface, an image thereon is fuzzier in its part closer to the end of the laser beam, that is, curvature of field develops in which an image is formed on a curved surface as shown in FIG. 28. If such a linear beam is used to perform annealing on an irradiation subject, annealing can not be uniformly performed.

In addition, under the present circumstances where substrate areas are increasing greatly, there is an urgent need to form the linear beam of approximately 1000 mm in the length direction. For example, in case of performing annealing on a large area substrate, if the linear beam of 300 mm in the length direction is used, it is impossible to perform annealing on the entire surface of the large area substrate with only one scanning by irradiating the linear beam to the large area substrate while moving the beam in one direction relative to the substrate, and it is required to move the beam in at least two directions or to irradiate the beam plural times, thereby reducing the throughput. As a result, depending on a scanning method of the laser beam, there is formed a region where annealing is performed plural times or a region where no annealing is performed, so that there is a strong possibility that the annealing is not uniformly performed. When the optical system is therefore devised which forms the linear beam having such a length in the length direction that makes it possible to perform annealing on the entire surface by moving the beam in only one direction along the large area substrate, for example, a length of 1000 mm, supposing the optical path length is in a range where it can be used in practice, the convergent position deviates at both ends of the irradiation surface in the length direction.

The cause that the convergent position deviates at both ends of the irradiation surface in the length direction by forming the laser beam which is long in the length direction is similar to that by making the optical path length short. It is because the difference of the optical path length depending on the incident position or incident angle becomes deviation of the convergent position and the curvature of field develops. Even if the linear beam is made longer in the length direction in order to perform annealing uniformly, as long as such a linear beam with the convergent position deviating at both ends in the length direction is used, annealing can not be uniformly performed.

SUMMARY OF THE INVENTION

In view of the above-mentioned problems, the present invention has an object to provide a laser irradiation apparatus having a short optical path length, and also to provide a laser irradiation apparatus capable of avoiding deviation of a convergent position at both ends of a rectangular beam, in particular, a linear beam, in a long-dimension direction. Further, the present invention has an object to provide a method of laser irradiation using such a laser irradiation apparatus, and also to provide a method of manufacturing a semiconductor device including the method of laser irradiation in a process.

The more astigmatism is corrected, the more curvature of field is reduced, which is a phenomenon that the convergent position deviates depending on an incident angle or incident position of a laser beam with respect to a lens. The present invention is therefore characterized in that, as shown in FIG. 1, a concave lens is inserted to regulate the optical path length of the laser beam and the convergent position is made coincident with an irradiation surface to form an image on the irradiation surface. In the present invention, an optical element, of course, is not limited to the concave lens but may be the optical element having a negative power, or a cylindrical lens which has a curvature only with respect to the direction parallel to the long-dimension direction. Further, the combination of a convex cylindrical lens and the concave lens or the combination of the convex cylindrical lens and a concave cylindrical lens may be used. In addition, a toroidal lens, a Crossed Cylindrical Lens, or the like may be used in the present invention.

Note that the convex cylindrical lens is the cylindrical lens having a positive power and the concave cylindrical lens is the cylindrical lens having the negative power. Also, the Crossed Cylindrical Lens is the cylindrical lens in which the curvatures of a first surface and a second surface of the lens are formed so as to be perpendicular to each other, and will be referred to as crossed cylindrical lens hereinafter.

According to the present invention, a structure of the invention disclosed in this specification relates to a laser irradiation apparatus, characterized by including: a laser; a first forming means for providing a laser beam emitted from the laser with a uniform energy distribution in a first direction perpendicular to an optical axis of the laser beam; a second forming means for regulating an optical path length to an irradiation surface of the laser beam to set a convergent position of the laser beam on the irradiation surface (including a plane in the vicinity thereof); and a third forming means for providing the laser beam with a uniform energy distribution in a second direction perpendicular to the optical axis of the laser beam and the first direction.

In the above structure, the laser is characterized by being a solid laser or gas laser of a continuous oscillation type or pulse oscillation type. Note that, examples of the solid laser include a continuous oscillation or pulse oscillation YAG laser, $YVO_4$ laser, YLF laser, $YAlO_3$ laser, glass laser, ruby laser, alexandrite laser, and Ti:sapphire laser. Examples of the gas laser include a continuous oscillation or pulse oscillation excimer laser, Ar laser, and Kr laser.

Further, in the above structure, it is desirable that the laser beam be converted into a harmonic by a non-linear optical element. For example, the YAG laser is known to emit the laser beam with a wavelength of 1065 nm as a fundamental wave. Since an absorption coefficient of this laser beam with respect to an amorphous silicon film is extremely low, under the present circumstances, it is technically difficult to perform crystallization of the amorphous silicon film which is one of semiconductor films. However, if the non-linear optical element is used, the laser beam can be converted into one having a shorter wavelength. Examples of the harmonics include a second harmonic (wavelength: 532 nm), a third harmonic (wavelength: 355 nm), a fourth harmonic (wavelength: 266 nm) and a fifth harmonic (wavelength: 213 nm). The absorption coefficients of those harmonics are high with respect to the amorphous silicon film, so that they can be used for performing crystallization of the amorphous silicon film.

Further, according to the present invention, another structure of the invention disclosed in this specification relates to a method of laser irradiation, characterized by including: providing a laser beam with a uniform energy distribution in a first direction perpendicular to an optical axis of the laser beam; regulating an optical path length to an irradiation surface of the laser beam to set a convergent position of the laser beam on the irradiation surface (including a plane in the vicinity thereof); providing the laser beam with a uniform energy distribution in a second direction perpendicular to the optical axis of the laser beam and the first direction; and irradiating the laser beam to an irradiation subject while moving the beam relative to the subject.

In the above structure, the laser is characterized by being a solid laser or gas laser of a continuous oscillation type or pulse oscillation type. Note that, examples of the solid laser include a continuous oscillation or pulse oscillation YAG laser, $YVO_4$ laser, YLF laser, $YAlO_3$ laser, glass laser, ruby laser, alexandrite laser, and Ti:sapphire laser. Examples of the gas laser include a continuous oscillation or pulse oscillation excimer laser, Ar laser, and Kr laser.

Further, in the above structure, it is desirable that the laser beam be converted into a harmonic by a non-linear optical element.

Further, according to the present invention, still another structure of the invention disclosed in this specification relates to a method of manufacturing a semiconductor device, characterized by including: providing a laser beam with a uniform energy distribution in a first direction perpendicular to an optical axis of the laser beam; regulating an optical path length to an irradiation surface of the laser beam to set a convergent position of the laser beam on the irradiation surface (including a plane in the vicinity thereof); providing the laser beam with a uniform energy distribution in a second direction perpendicular to the optical axis of the laser beam and the first direction; and irradiating the laser beam to a semiconductor film while moving the beam relative to the film.

In the above structure, the laser is characterized by being a solid laser or gas laser of a continuous oscillation type or pulse oscillation type. Note that, examples of the solid laser include a continuous oscillation or pulse oscillation YAG laser, $YVO_4$ laser, YLF laser, $YAlO_3$ laser, glass laser, ruby laser, alexandrite laser, and Ti:sapphire laser. Examples of the gas laser include a continuous oscillation or pulse oscillation excimer laser, Ar laser, and Kr laser.

Further, in the above structure, it is desirable that the laser beam be converted into a harmonic by a non-linear optical element.

Further, in the above structure, it is desirable that the semiconductor film contain silicon.

The present invention is extremely effective in cases for reducing the optical path length of the optical system to easily perform optical adjustment, and also extremely effective in case of forming the laser beam having a length that corresponds to the length of a large area substrate. This is because, although there is an urgent need to irradiate the laser beam to the large area substrate only once in one direction while moving the beam relative to the substrate in order to perform annealing uniformly with high efficiency, the longer the length of the laser beam in the length direction becomes, the larger deviation develops in the incident position and in the incident angle with respect to the lens and the more easily the curvature of field occurs. It is remarkably important to perform annealing uniformly in order to make properties of the irradiation subject uniform. For example, if the irradiation subject is the semiconductor film, uniform film properties are realized for the semiconductor film which is annealed uniformly, thereby enabling to reduce a variation of electrical characteristics of a TFT manufactured from these semiconductor films. Further, in the semiconductor device manufactured from these TFTs, operational characteristics and reliability thereof can be improved.

BRIEF DESCRIPTION OF THE DRAWINGS

In the accompanying drawings:

FIGS. 18A to 18C are cross-sectional views showing a manufacturing process of a pixel TFT and a TFT of a driver circuit;

FIGS. 19A to 19C are cross-sectional views showing a manufacturing process of the pixel TFT and the TFT of the driver circuit;

DETAILED DESCRIPTION OF THE PREFERRED EMBODIMENTS

Figure 1:
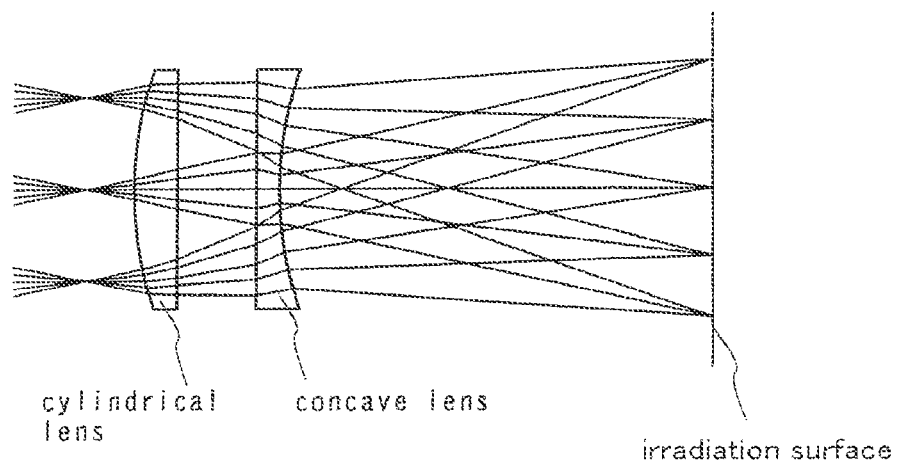
FIG. 1 shows an example of avoiding curvature of field by a concave lens.

In this embodiment mode, a method of correcting a convergent position that deviates even in a case where an optical path length is as short as 2821.7 mm will be explained by using FIGS. 6A, 6B, and 7. There will be described here about an optical system for making a laser beam emitted from a laser into a linear beam of 300 mm in length. However, the present invention is not limited to the case where a length of the linear beam is 300 mm, but may be similarly applied to the case where it is longer than or shorter than 300 mm. Also, the optical path length is not limited to the above value.

Note that, in this specification, a description of arrangement of lenses will be made referring to a direction in which photons travel along an optical axis of the laser beam as a forward direction. Also, a side of the lens upon which the laser beam is incident is referred to as a first surface and a side of the lens from which the laser beam is emitted is referred to as a second surface. A curvature radius of the first surface is represented by $R_1$ and a curvature radius of the second surface is represented by $R_2$. A sign of the curvature radius to be used is a minus when a center of curvature is at the side upon which the laser beam is incident viewed from the lens, is a plus when it is at the side from which the laser beam is emitted, and is $\infty$ in the case of a plane. Further, the lenses to be used are all made from synthetic quartz glass (refractive index: 1.485634), but may not be limited thereto. Also, if coating applied on the surface of the synthetic quartz glass is appropriately replaced depending on a wavelength of the laser to be used, the lens can be applied to various kinds of lasers.

FIG. 6A shows the optical system with a long-dimension direction being viewed perpendicularly and FIG. 6B shows the optical system with a in the width direction being viewed perpendicularly.

The laser beam emitted from the laser 1301 is expanded to be twice as large both in the length direction and the in the width direction by a beam expander. Note that the beam expander is effective particularly in the case where a shape of the laser beam emitted from the laser is small, and may not be used depending on a size of the laser beam.

Then, the laser beam emitted from the beam expander enters cylindrical lens arrays 1403a and 1403b and a cylindrical lens 1404 structuring a first forming means. The three lenses are arranged such that curvatures thereof are parallel to each other in the length direction. Further, there is provided a toroidal lens 1506b which is a second forming means. Note that it is desirable that the curvature thereof be within a range of 13,000 to 18,000. Due to these lenses, the laser beam is made uniform in energy in the length direction.

The laser beam emitted from the cylindrical lens 1404 is transmitted through cylindrical lens arrays 1405a and 1405b structuring a third forming means, and enters the cylindrical lens 1406a and the toroidal lens 1506b. Due to these lenses, an energy distribution of the laser beam is made uniform in a in the width direction and, at the same, the laser beam is contracted.

Figure 7:
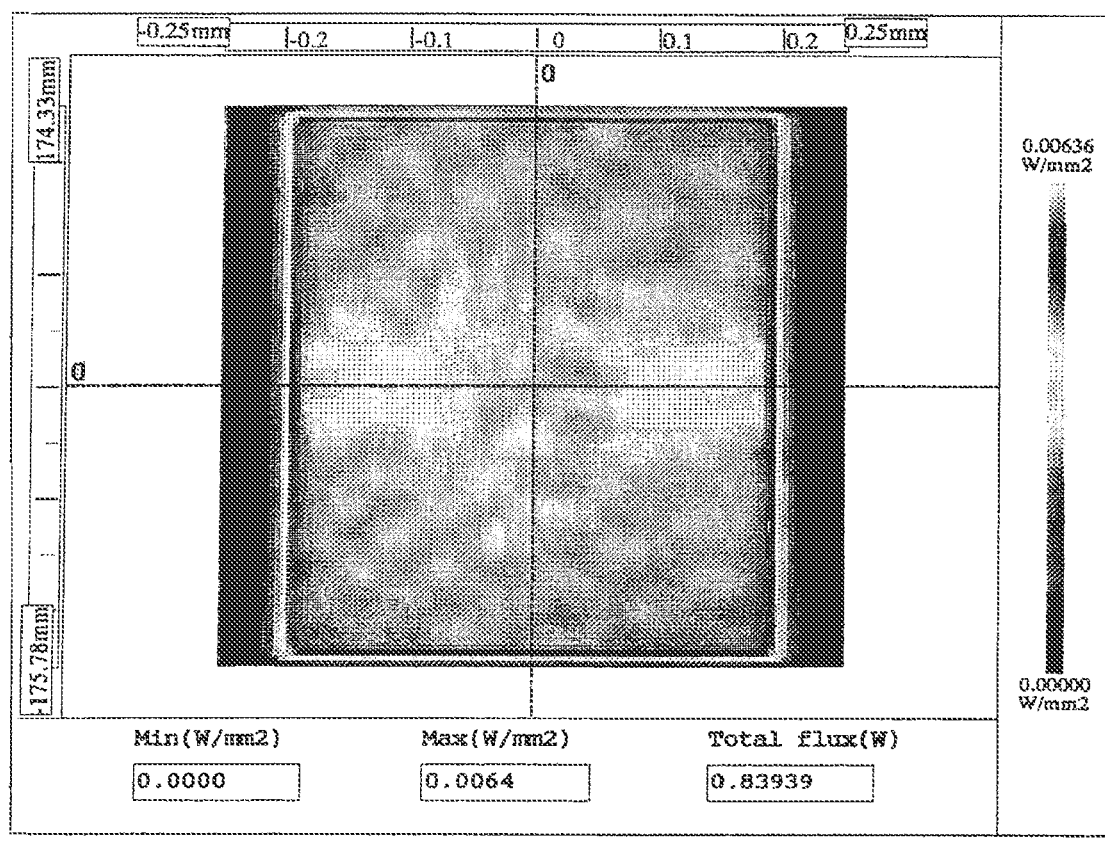
FIG. 7 shows an example of a distribution of laser beam energy which is formed on an irradiation surface by the optical system shown in FIGS. 6A and 6B.
Figure 8:
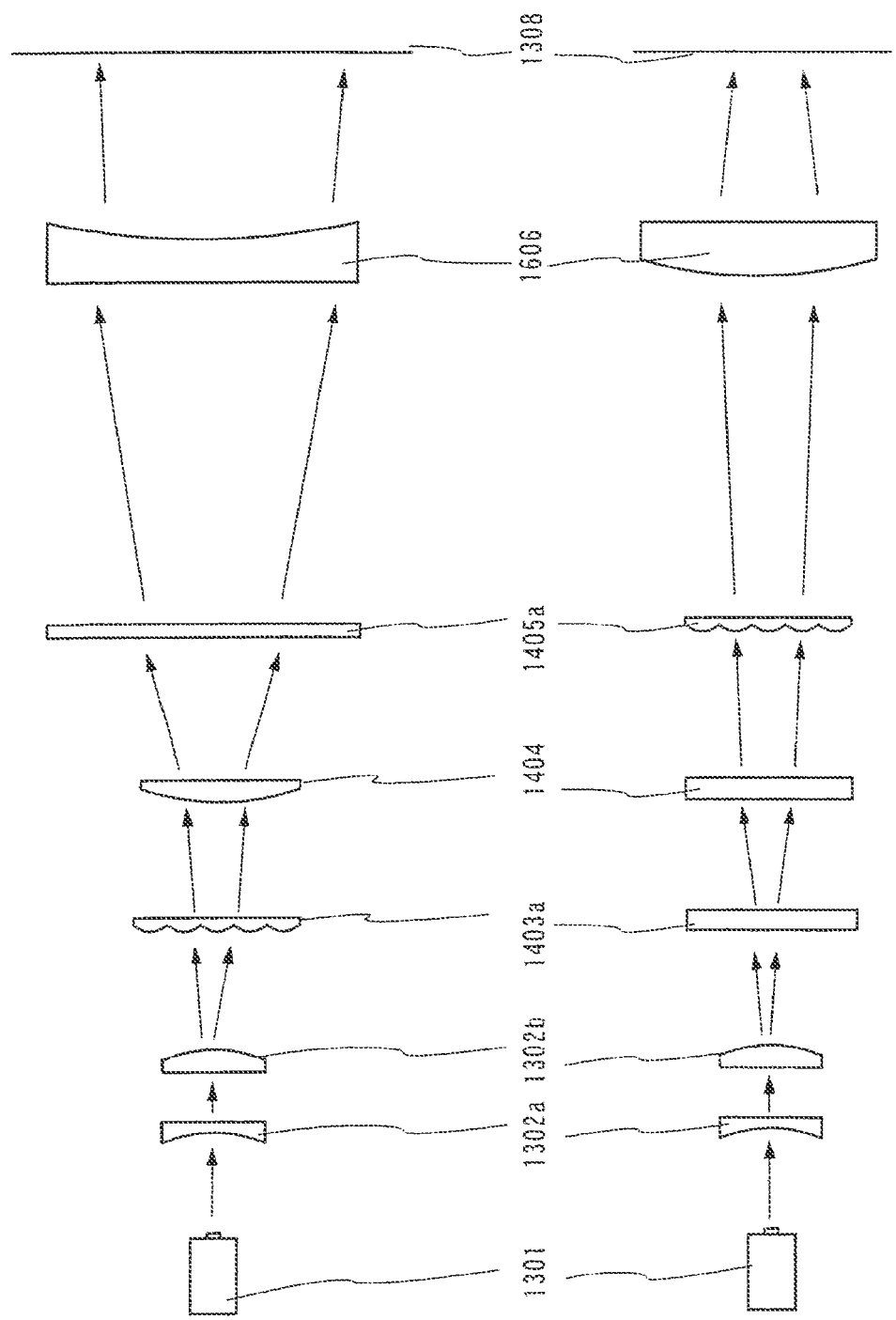
FIGS. 8A and 8B show an example of an optical system which is used for forming a rectangular beam.

FIG. 7 shows a simulation result of the energy distribution of the linear beam on an irradiation surface 1308 formed by the above optical system. In FIG. 7, the abscissa axis represents the length in the in the width direction and the ordinate axis represents the length in the length direction. According to FIG. 7, widths in the vicinity of the center and at both ends of the linear beam in the length direction are the same. This indicates that the convergent position is coincident with the irradiation surface. That is, uniformity of the energy distribution is excellent.

If annealing is performed on a semiconductor film by using a laser irradiation apparatus such as the above optical system, it is possible to crystallize the semiconductor film, to improve crystallinity to obtain a crystalline semiconductor film, and to perform activation of an impurity element.

Alternatively, although the toroidal lens is used as the third forming means in this embodiment mode, there is no limitation thereto, so that the lens with a curvature radius of the first surface being minus or the lens with a curvature radius of the second surface being plus may be used, and that the cylindrical lens each surface of which has a curvature only with respect to the direction parallel to the long-dimension direction may also be used. In addition, a concave lens and a crossed cylindrical lens, or the like may be used.

Further, although the convergent position that deviates at both ends of the laser beam is corrected by changing the lens closest to the irradiation surface or inserting the additional lens in this embodiment mode, there is of course no limitation to this position.

Note that, although the laser beam having a shape on the irradiation surface being a linear shape is formed in this embodiment mode, the present invention is not limited to the linear shape. For example, in FIGS. 6A and 6B, an expansion function is provided in the length direction and in the width direction by using the cylindrical lens arrays 1403a and 1403b and cylindrical lens arrays 1405a and 1405b. However, if the cylindrical lens array 1403b and cylindrical lens array 1405b are removed, the laser beam is not to be expanded, thereby forming the laser beam having a smaller aspect ratio than the laser beam formed by the optical system shown in FIGS. 6A and 6B. Also, since a type of the laser beam emitted from the laser varies, even if the shape is formed by the optical system, affection of an original shape is likely to occur. For example, the shape of the laser beam emitted from an XeCl excimer laser (wavelength: 308 nm, pulse width: 30 ns) is a rectangular shape of 10 mm×30 mm (both being a half-value width in a beam profile). The shape of the laser beam emitted from a solid laser is a circular shape if a rod shape thereof is a cylindrical shape, and is the rectangular shape if the rod shape is a slab-like shape. In every shape, there occurs no problem as long as the shape provides an energy density which is sufficient for annealing of the irradiation subject, thereby enabling to apply the present invention thereto.

In accordance with the present invention with the above-described structure, a further detailed description will be given with respect to embodiments described hereinbelow.

Embodiment 1

In this embodiment, an example of applying the present invention is described in the case that an optical path length of an optical system which forms a laser beam into a linear shape is made smaller. In addition, in an explanation of an arrangement of lenses, a travel direction of photon at an optical axis of a laser beam indicates forward.

Figure 2:
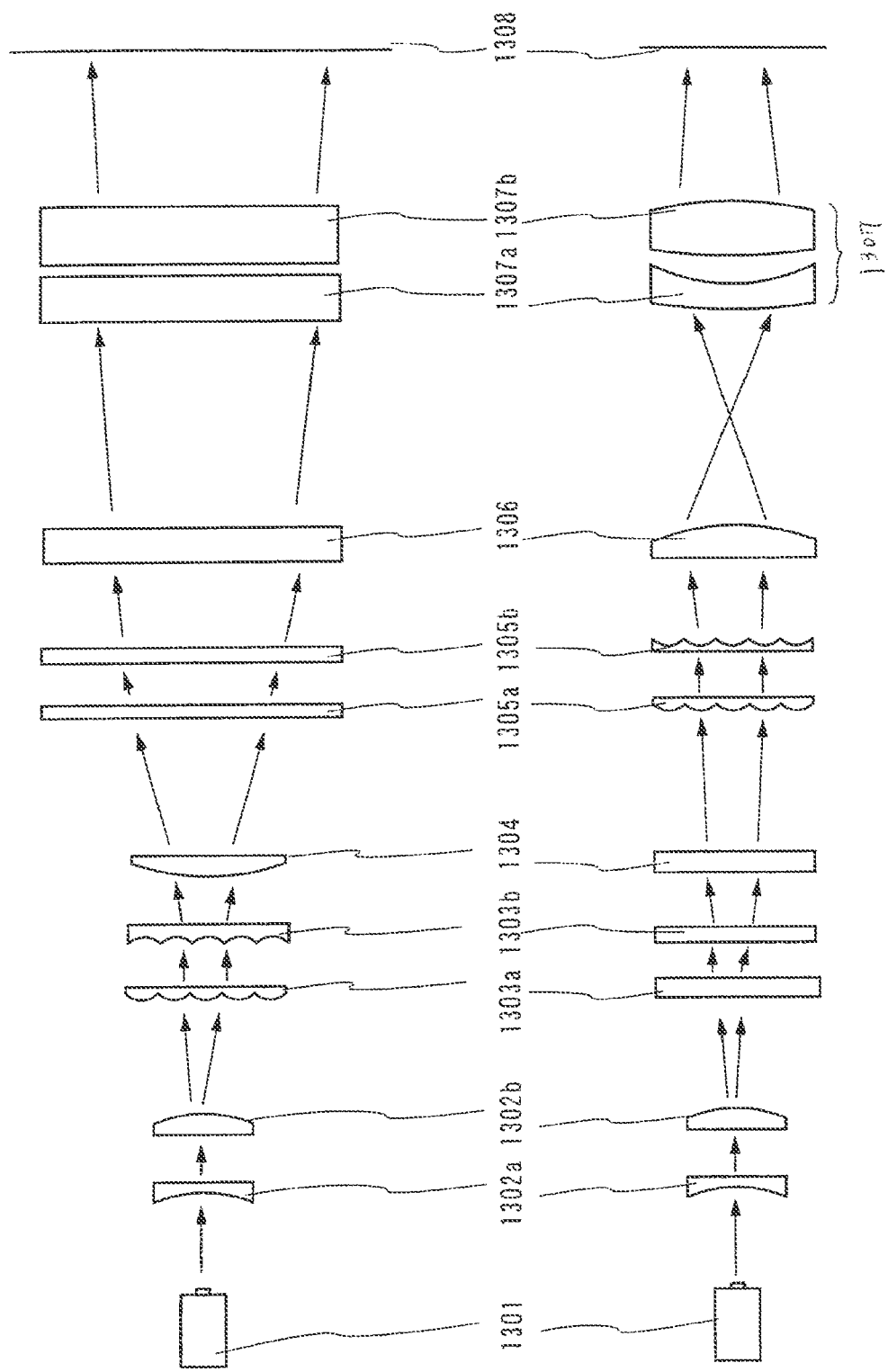
FIGS. 2A and 2B show an example of an optical system having an optical path length of approximately 5,000 mm which is used for forming a linear beam of 300 mm in length in a long-dimension direction.

First, an optical system having a 5065.2 mm in an optical path length for forming a linear beam having a 300 mm in longitudinal direction is illustrated. FIG. 2A shows an optical system in the case where a longitudinal direction of laser beam is viewed from a direction perpendicular thereto and FIG. 2B shows the optical system in the case where a width direction of laser beam is viewed from a direction perpendicular thereto.

Laser beam emitted from a laser 1301 is expanded by a beam expander in both the longitudinal direction and the width direction by about two times. The beam expander is composed of a spherical lens (50 mm in radius, 7 mm in thickness, $R_1=-220$ mm, and $R_2=\infty$) 1302a and a spherical lens (50 mm in radius, 7 mm in thickness, $R_1=\infty$, and $R_2=-400$ mm) 1302b which is located at a distance of 400 mm from the spherical lens 1302a. The two lenses 1302a and 1302b that have a function of expansion the size of the laser beam are referred to as a beam expander. To refract the optical path, plural mirrors tend to be provided between laser and lenses that are located before the beam expanders.

The laser beam emitted from the beam expander is incident into a cylindrical lens array 1303a which is located at a distance of 50 mm from the beam expander toward the front. After that, the laser beam is transmitted through a cylindrical lens array 1303b which is located at a distance of 88 mm from the cylindrical lens array 1303a toward the front, and then incident into a cylindrical lens 1304 which is located at a distance of 120 mm from the cylindrical lens array 1303b toward the front. The cylindrical lens array 1303a includes 40 cylindrical lenses (each having 60 mm in length, 2 mm in width, 5 mm in thickness, $R_1=28$ mm, and $R_2=\infty$) located. The cylindrical lens array 1303b includes 40 cylindrical lenses (each having 60 mm in length, 2 mm in width, 5 mm in thickness, $R_f=-13.33$ mm, and $R_2=\infty$) located. The cylindrical lens 1304 is a cylindrical lens having 150 mm in length, 60 mm in width, 20 mm in thickness, $R_1=2140$ mm, and $R_2\infty$. The cylindrical lens arrays 1303a and 1303b and the cylindrical lens 1304 each are arranged such that curvatures thereof are parallel to each other in the longitudinal direction. Due to these lenses, the laser beam is made uniform in energy in the longitudinal direction.

The laser beam emitted from the cylindrical lens 1304 is incident into a cylindrical lens array 1305a which is located at a distance of 395 mm from the cylindrical lens 1304 toward the front. After that, the laser beam is transmitted through a cylindrical lens array 1305b which is located at a distance of 65 mm from the cylindrical lens array 1305a toward the front, and then incident into a cylindrical lens 1306 which is located at a distance of 1600 mm from the cylindrical lens array 1305b toward the front. The cylindrical lens array 1305a includes 16 cylindrical lenses (each having 150 mm in length, 2 mm in width, 5 mm in thickness, $R_1=100$ mm, and $R_2=\infty$) located in array. The cylindrical lens array 1305b includes 16 cylindrical lenses (each having 150 mm in length, 2 mm in width, 5 mm in thickness, $R_1=\infty$, and $R_2=80$ mm) located. The cylindrical lens 1306 is a cylindrical lens having 900 mm in length, 60 mm in width, 20 mm in thickness, $R_1=\infty$, and $R_2=-486$ mm. The cylindrical lens arrays 1305a and 1305b and the cylindrical lens 1306 each are arranged such that the curvature is parallel to the width direction. By these three lenses, an energy density distribution of the laser beam is homogenized in the width direction and simultaneously a width thereof is shortened. Thus, linear laser beam having a width of 2 mm is produced at a distance of 800 mm from the cylindrical lens 1306 toward the front.

In order to further shorten the above linear laser beam having the width of 2 mm in a width direction, a doublet cylindrical lens 1307 is located at a distance of 2050 mm from the cylindrical lens 1306 toward the front. The doublet cylindrical lens 1307 is composed of two cylindrical lenses 1307a and 1307b. The cylindrical lens 1307a is a cylindrical lens having 400 mm in length, 70 mm in width, 10 mm in thickness, $R_1=125$ mm, and $R_2=77$ mm. The cylindrical lens 1107b is a cylindrical lens having 400 mm in length, 70 mm in width, 10 mm in thickness, $R_1=97$ mm, and $R_2=-200$ mm. In addition, the cylindrical lenses 1307a and 1307b are located at an interval of 5.5 mm. The cylindrical lenses 1307a and 1307b each are arranged such that the curvature is parallel to the width direction.

Figure 3:
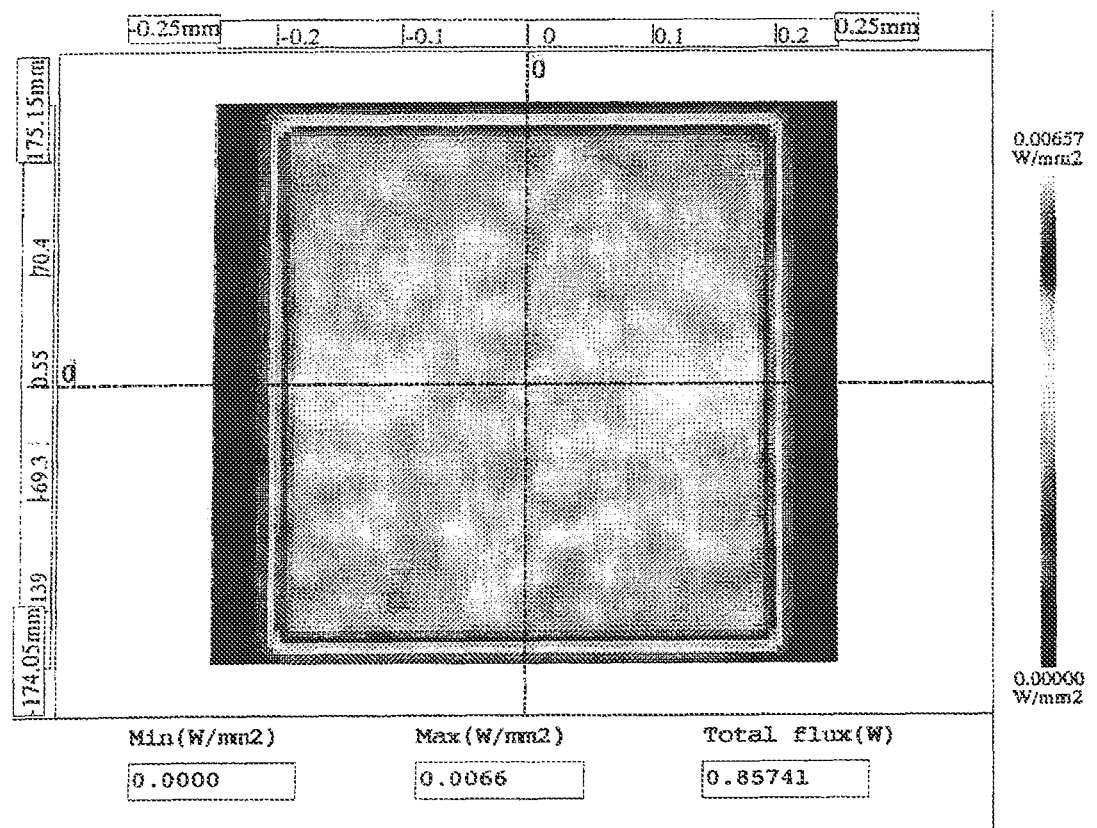
FIG. 3 shows an example of a distribution of laser beam energy which is formed on an irradiation surface by the optical system shown in FIGS. 2A and 2B.

The simulation result of the laser beam that is formed by the optical system is shown in FIG. 3. In FIG. 3, the abscissa axis represents the length in the width direction and the ordinate axis represents the length in the length direction. Linear laser beam having 300 mm in length and 0.4 mm in width is produced on a surface at a distance of 237.7 mm from the doublet cylindrical lens 1307 toward the front. At this time, the linear beam has a same width in the vicinity of the center and at both ends of the linear beam in the length direction. It is corresponded that a convergent position is accord in the irradiation surface. That is, uniformity of the energy distribution is excellent.

Figure 4:
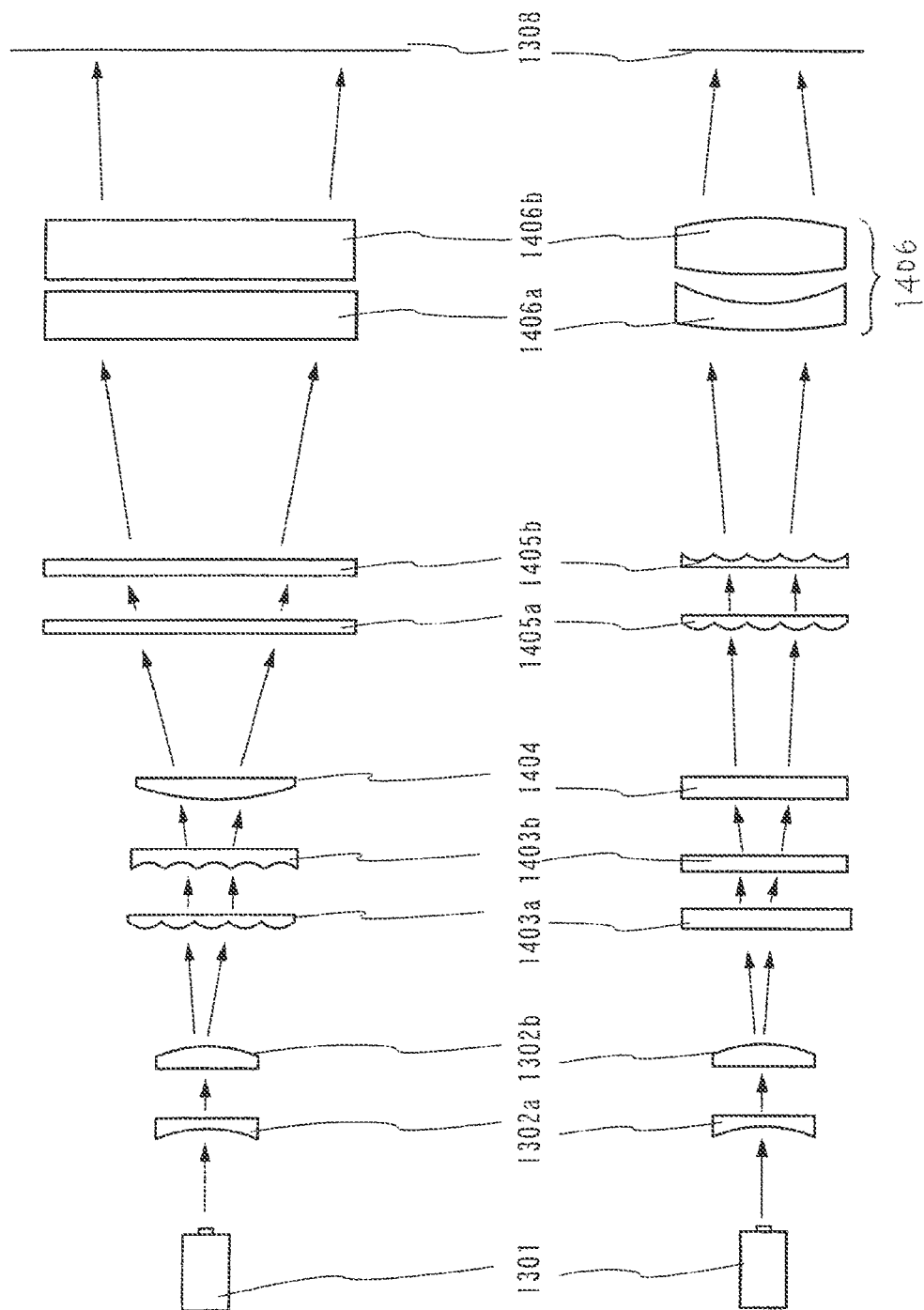
FIGS. 4A and 4B show an example of an optical system having an optical path length of approximately 2,400 mm which is used for forming a linear beam of 300 mm in length in a long-dimension direction.

Next, an optical system that is shorten above mentioned optical system having 5065.2 mm in optical lath length to 2400 mm in order to form into a linear beam having 300 mm in length is described. FIG. 4A shows an optical system in the case where a longitudinal direction is viewed from a direction perpendicular thereto and FIG. 4B shows the optical system in the case where a width direction is viewed from a direction perpendicular thereto.

Laser beam emitted from a laser 1301 is expanded by a beam expander in both the longitudinal direction and the width direction by about two times. The beam expander is composed of a spherical lens (50 mm in radius, 7 mm in thickness, $R_1=-220$ mm, and $R_2=\infty$) 1302a and a spherical lens (50 mm in radius, 7 mm in thickness, $R_1=\infty$, and $R_2=-400$ mm) 1303b which is located at a distance of 400 mm from the spherical lens 1302a.

The laser beam emitted from the beam expander is incident into a cylindrical lens array 1403a which is located at a distance of 50 mm from the beam expander toward the front. After that, the laser beam is transmitted through a cylindrical lens array 1403b which is located at a distance of 41 mm from the cylindrical lens array 1403a toward the front, and then incident into a cylindrical lens 1404 which is located at a distance of 120 mm from the cylindrical lens array 1403b toward the front. The cylindrical lens array 1403a includes 40 cylindrical lenses (each having 150 mm in length, 2 mm in width, 5 mm in thickness, $R_1$=1.5 mm, and $R_2$=∞) located. The cylindrical lens array 1403b includes 40 cylindrical lenses (each having 150 mm in length, 2 mm in width, 5 mm in thickness, $R_1$=−11 mm, and $R_2$=∞) located. The cylindrical lens 1404 is a cylindrical lens having 150 mm in length, 60 mm in width, 20 mm in thickness, $R_1$=1078 mm, and $R_2$=∞. The cylindrical lens arrays 1403a and 1403b and the cylindrical lens 1404 each are arranged such that the curvature is parallel to the longitudinal direction. Due to these lenses, the laser beam is made uniform in energy in the longitudinal direction.

The laser beam emitted from the cylindrical lens 1404 is incident into a cylindrical lens array 1405a which is located at a distance of 870 mm from the cylindrical lens 1404 toward the front. After that, the laser beam is transmitted through a cylindrical lens array 1405b which is located at a distance of 70 mm from the cylindrical lens array 1405a toward the front, and then incident into a cylindrical lens 1406 which is located at a distance of 1000 mm from the cylindrical lens array 1405b toward the front. The cylindrical lens array 1405a includes 16 cylindrical lenses (each having 400 mm in length, 2 mm in width, 5 mm in thickness, $R_1$=100 mm, and $R_2$=∞) located in array. The cylindrical lens array 1405b includes 16 cylindrical lenses (each having 400 mm in length, 2 mm in width, 5 mm in thickness, $R_1$=∞, and $R_2$=80 mm) located. A doublet cylindrical lens 1406 is a lens composed of two cylindrical lenses 1406a and 1406b. The cylindrical lens 1406a is a cylindrical lens having 400 mm in length, 70 mm in width, 10 mm in thickness, $R_1$=125 mm, and $R_2$=77 mm. The cylindrical lens 1406b is a cylindrical lens having 400 mm in length, 70 mm in width, 10 mm in thickness, $R_1$=97 mm, and $R_2$=−200 mm. In addition, the cylindrical lenses 1406a and 1406b are located at an interval of 5.5 mm. The cylindrical lenses 1406a and 1406b each are arranged such that the curvature is parallel to the width direction.

Due to cylindrical lens arrays 1405a, 1405b, and a doublet cylindrical lens 1406, an energy distribution of the laser beam is made uniform in the width direction and, at the same time, the laser beam is contracted.

Figure 5:
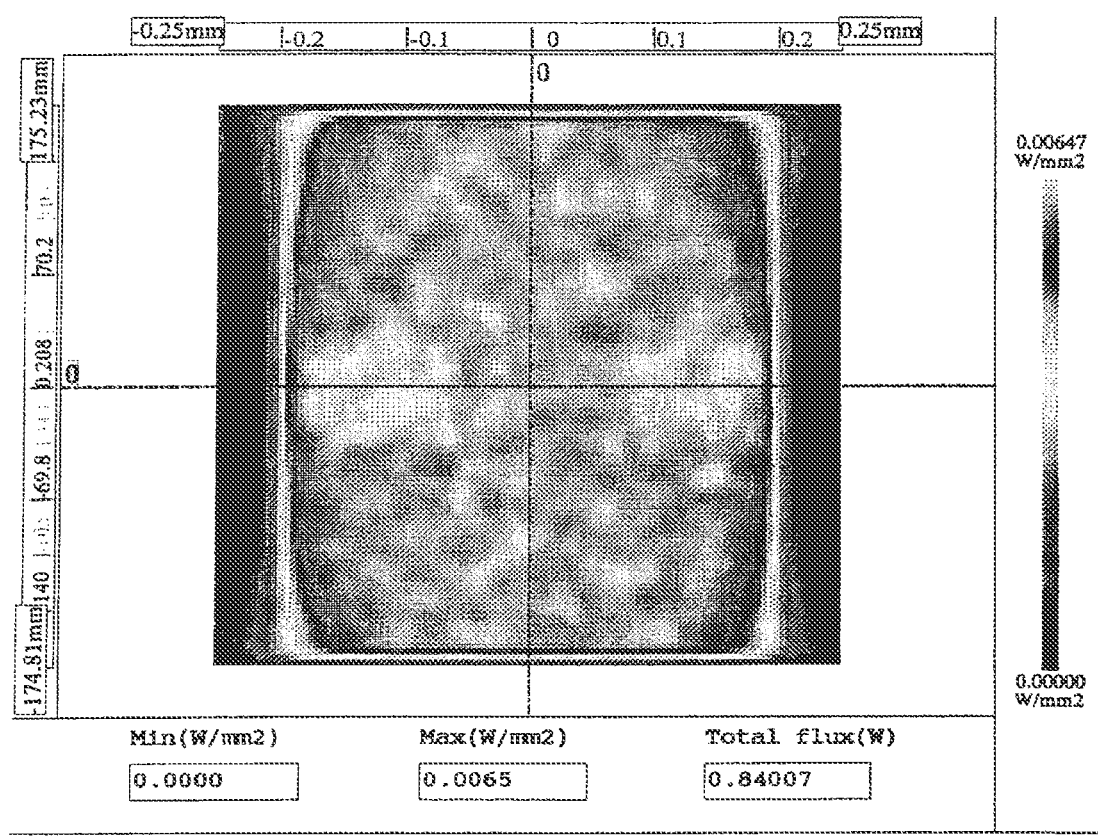
FIG. 5 shows an example of a distribution of laser beam energy which is formed on an irradiation surface by the optical system shown in FIGS. 4A and 4B.

The simulation result of the laser beam at an irradiation surface 1309 which is formed by the optical system is shown in FIG. 5. In FIG. 5, an axis of abscissa indicates the length of the width direction and an axis of ordinate indicates the length of the longitudinal direction. Linear laser beam having 300 mm in length and 0.4 mm in width is produced on an irradiation surface 1308 at a distance of 191.2 mm from the doublet cylindrical lens 1406 toward the front. At this time, the produced linear laser beam has end portions in the longitudinal direction thereof is wider that that of central portions thereof. That is, uniformity of the energy distribution is deteriorated.

Figure 6:
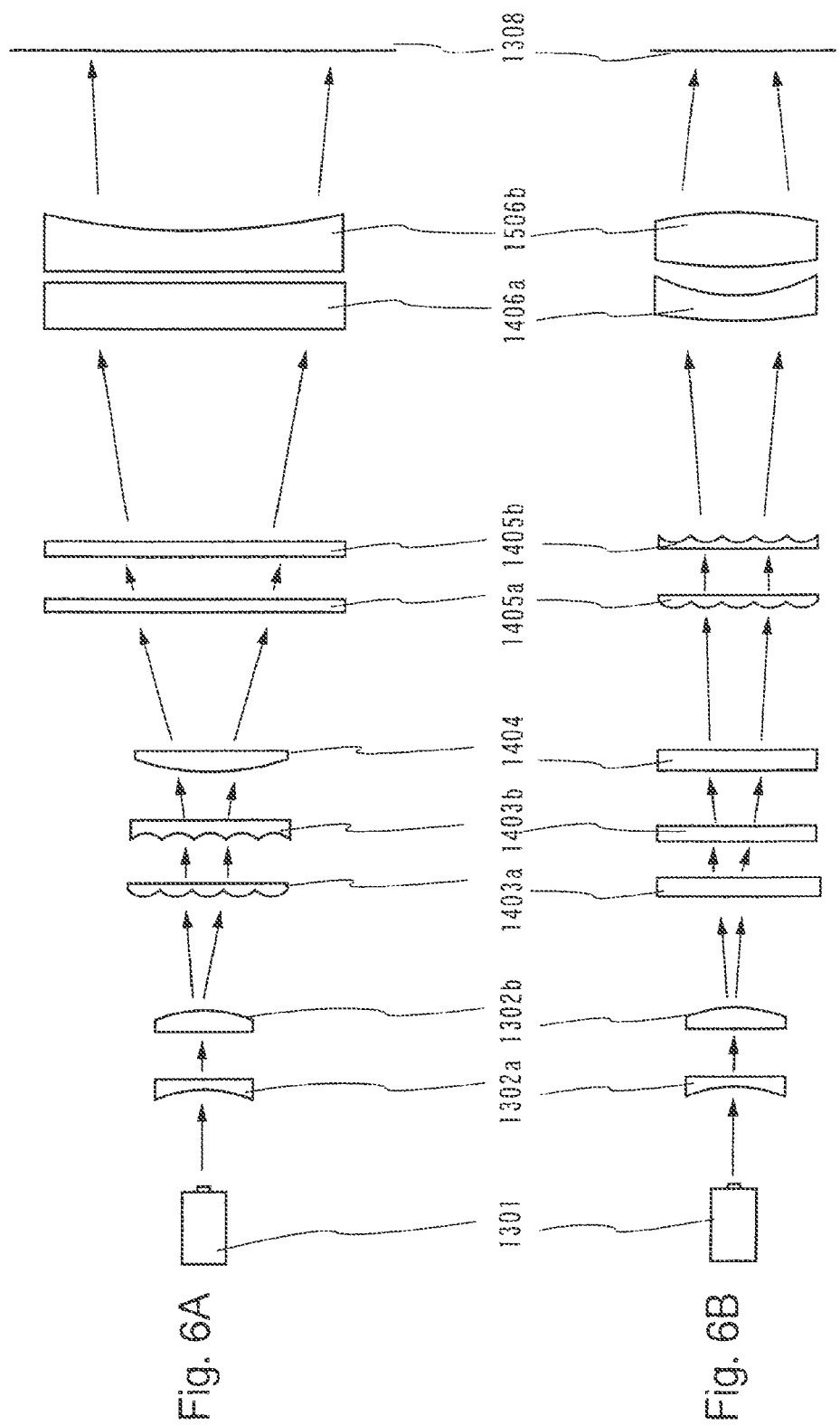
FIGS. 6A and 6B show an example of an optical system having an optical path length of approximately 2,400 mm which is used for forming a linear beam of 300 mm in length in a long-dimension direction by using a toroidal lens.

A method to solve the problem is described by using FIG. 6. FIG. 6A shows an optical system in the case where a longitudinal direction is viewed from a direction perpendicular thereto and FIG. 6B shows the optical system in the case where a width direction is viewed from a direction perpendicular thereto. Instead of a cylindrical lens 1406b, that is one of components of doublet cylindrical lens 1406 in FIG. 4, a lens 1506b having curvature in the longitudinal direction of the cylindrical lens 1406b second surface is provided. The lens with which curvature differs in the longitudinal direction and the width direction is referred to as troidal lens. However, the curvature has 15000 mm in length (preferably 13000 to 18000 mm) and the curvature center is at the side of emission.

The simulation result of the laser beam that is formed by the optical system is shown in FIG. 7. In FIG. 7, the abscissa axis represents the length in the width direction and the ordinate axis represents the length in the longitudinal direction. It has the width with same center portion and end portions in the longitudinal direction of the linear beam that is produced on an irradiation surface 1308 at a distance of 191.2 mm from the troidal lens toward the front. This indicates that the convergent position is coincident with the irradiation surface. That is, uniformity of the energy distribution is excellent.

Embodiment 2

Figure 9:
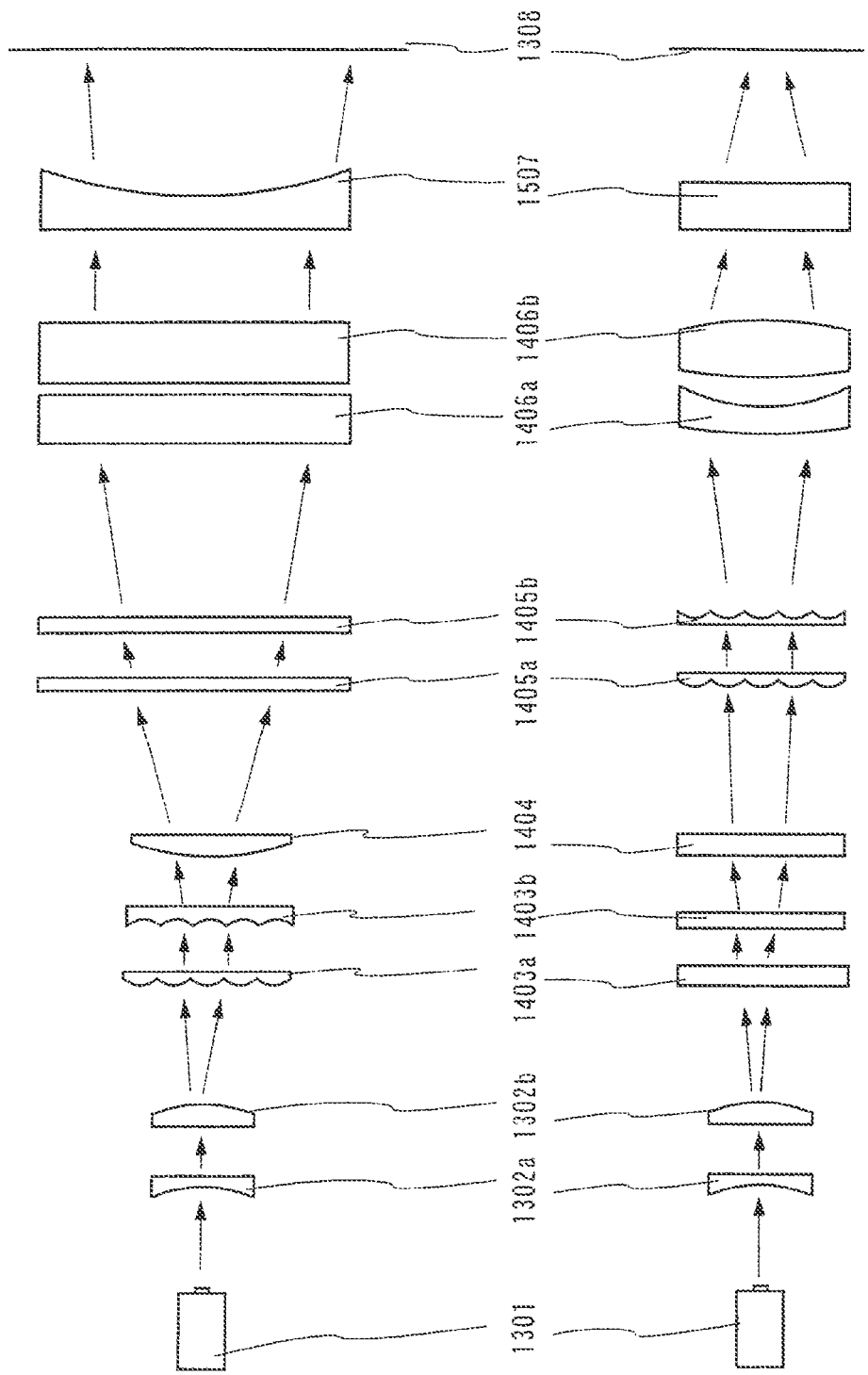
FIGS. 9A and 9B show an example of an optical system which is used for forming a linear beam of 300 mm in length in a long-dimension direction.

In Embodiment 1, a deviation of a convergent position is avoided by providing the second lens 1406b of the doublet cylindrical lens instead of the troidal lens. In this embodiment, a method that a deviation of a convergent position is corrected by newly adding one cylindrical lens, without changing the form of the doublet cylindrical lens 1406 is described with reference FIG. 9. FIG. 9A shows an optical system in the case where a longitudinal direction is viewed from a direction perpendicular thereto and FIG. 9B shows the optical system in the case where a width direction is viewed from a direction perpendicular thereto.

Figure 10:
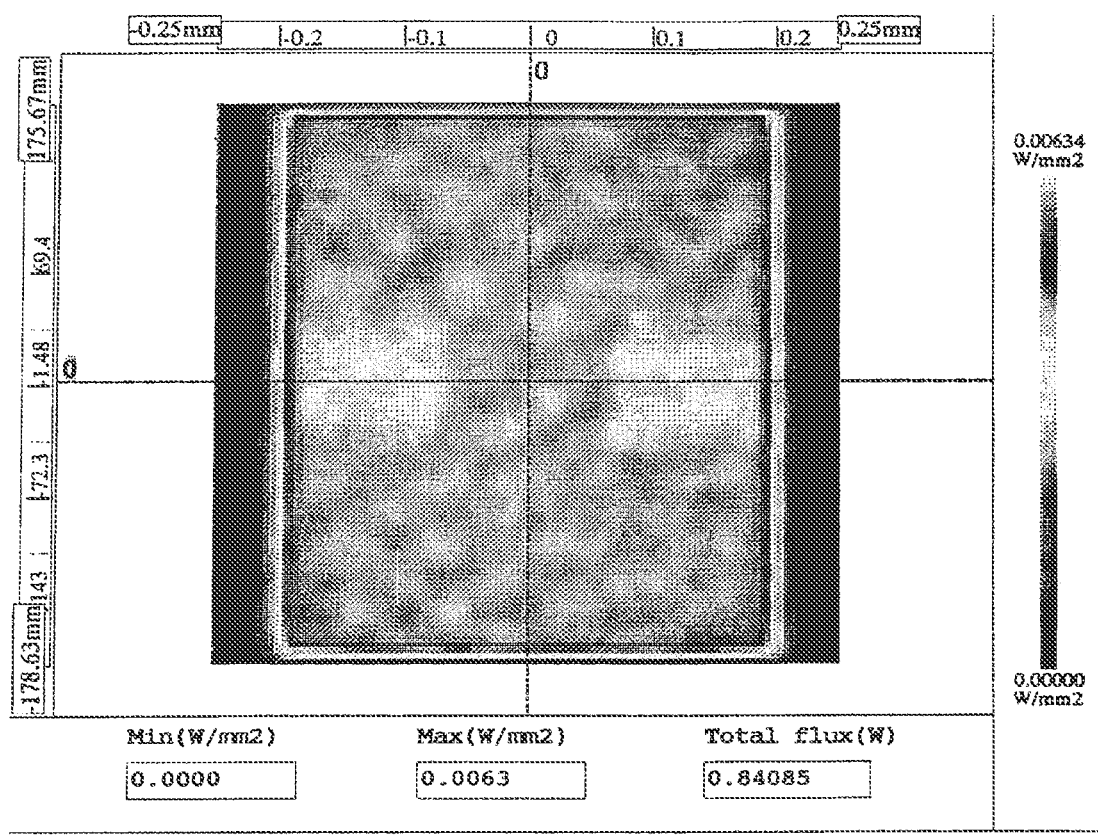
FIG. 10 shows an example of a distribution of laser beam energy which is formed on an irradiation surface by the optical system shown in FIGS. 9A and 9B.

A cylindrical lens 1507 is added at a distance of 40 mm from the doublet cylindrical lens 1406 in the optical system (FIGS. 4A and 4B) shown in Embodiment 1. The cylindrical lens 1507 has 400 mm in length, 70 mm in width, 20 mm in thickness, $R_1$=∞, and $R_2$=7000 mm (preferably 4000 to 10000 mm). The cylindrical lens 1507 is arranged such that the curvature is parallel to the longitudinal direction. (FIG. 9) The simulation result of an energy distribution of a linear beam irradiating on the surface 1308, which is located at a distance of 137.5 mm from the cylindrical lens 1507 toward the front, is shown in FIG. 10. In FIG. 10, an axis of abscissa represents the length of the width direction and an axis of ordinate represents the length of the longitudinal direction. According to FIG. 10, widths in the vicinity of the center and at both ends of the linear beam in the length direction are the same. This indicates that the convergent position is coincident with the irradiation surface. That is, uniformity of the energy distribution is excellent.

Embodiment 3

Figure 11:
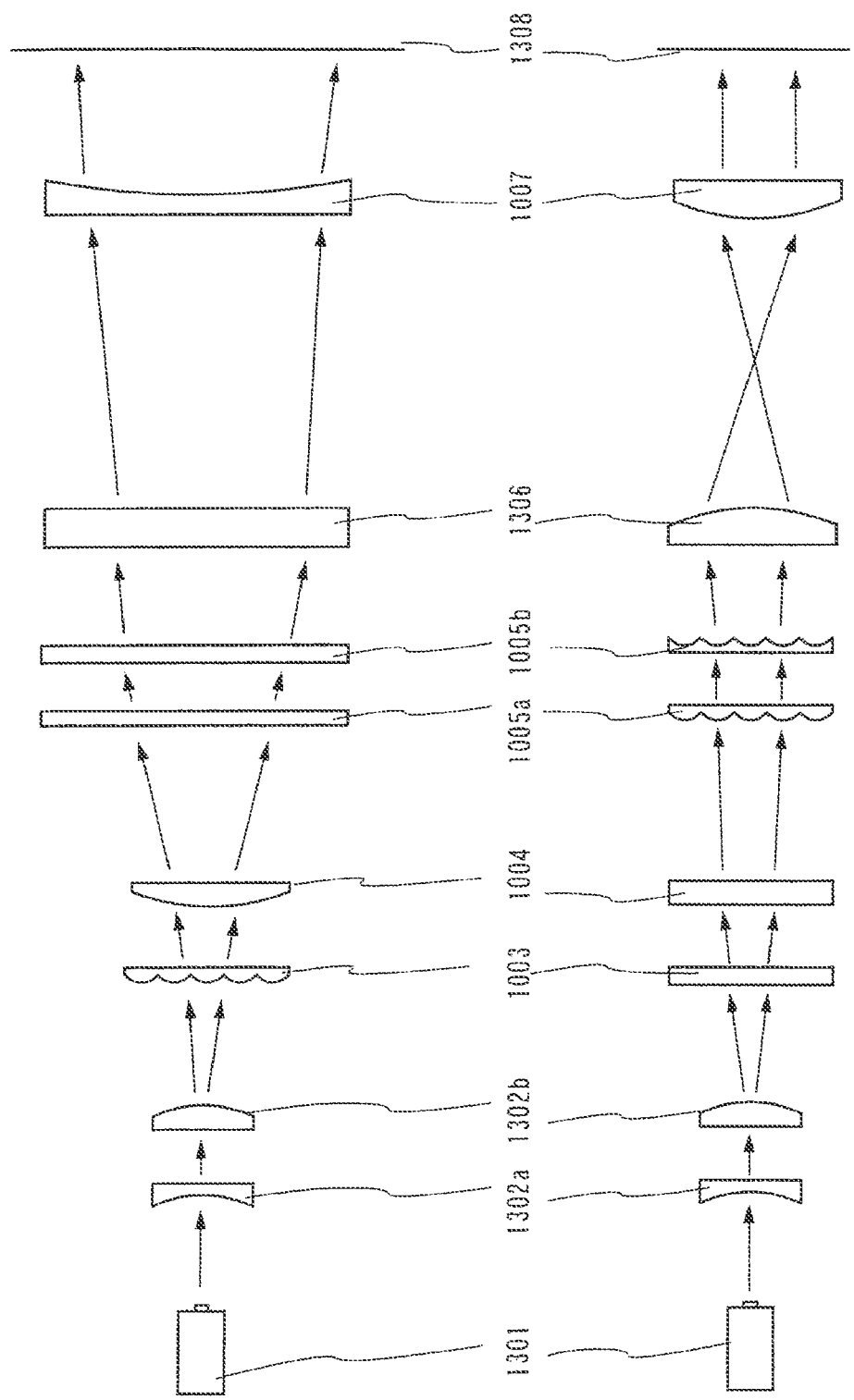
FIGS. 11A and 11B show an example of an optical system which is used for forming a linear beam of 1,000 mm in length in a long-dimension direction.

In this embodiment, an example of an optical system in order to form a linear beam having 1000 mm in length in the longitudinal direction on an irradiation surface. FIG. 11A shows an optical system in the case where a longitudinal direction is viewed from a direction perpendicular thereto and FIG. 11B shows the optical system in the case where a width direction is viewed from a direction perpendicular thereto.

Laser beam emitted from a laser 1301 is expanded by a beam expander in both the longitudinal direction and the width direction by about two times. The beam expander is composed of a spherical lens (50 mm in radius, 7 mm in thickness, $R_1$=−220 mm, and $R_2$=∞) 1302a and a spherical lens (50 mm in radius, 7 mm in thickness, $R_1$=∞, and $R_2$=−400 mm) 1303b which is located at a distance of 400 mm from the spherical lens 1302a.

The cylindrical lens array 1003 includes 40 cylindrical lenses (each having 150 mm in length, 2 mm in width, 5 mm in thickness, $R_1$=4 mm, and $R_2$=∞) located. The cylindrical lens 1004 has 150 mm in length, 450 mm in width, 15 mm in thickness, $R_1$=2140 mm, and $R_2$=∞. The cylindrical lens array 1003 and the cylindrical lens 1004 each are arranged such that the curvature is parallel to the longitudinal direction.

The laser beam emitted from the beam expander is incident into a cylindrical lens array 1003 which is located at a distance of 50 mm from the lens 1002b toward the front. After that, the laser beam is divided and superposed by the cylindrical lens 1004 which is located at a distance of 15 mm from the doublet cylindrical lens 1004 toward the front. The laser beam is made uniform in energy on the irradiation surface 1308 in the longitudinal direction. A combination of the cylindrical lens array and the cylindrical lens that make the laser beam uniform in energy distribution is referred to as a beam homogenizer. Due to a combination of curvature of these two lenses, a length of a linear beam is determined.

The laser beam emitted from the cylindrical lens 1004 is incident into a cylindrical lens array 1005a which is located at a distance of 395 mm from the cylindrical lens 1004 toward the front. After that, the laser beam is transmitted through a cylindrical lens array 1005b which is located at a distance of 65 mm from the cylindrical lens array 1005a toward the front, and then incident into a cylindrical lens 1006 which is located at a distance of 1600 mm from the cylindrical lens array 1005b toward the front. The cylindrical lens array 1005a includes 16 cylindrical lenses (each having 900 mm in length, 2 mm in width, 5 mm in thickness, $R_1$=100 mm, and $R_2$=∞) located in array. The cylindrical lens array 1005b includes 16 cylindrical lenses (each having 900 mm in length, 2 mm in width, 5 mm in thickness, $R_1$=∞, and $R_2$=80 mm) located. The cylindrical lens 1306 is a cylindrical lens having 900 mm in length, 60 mm in width, 20 mm in thickness, $R_1$=∞, and $R_2$=−486 mm. The cylindrical lens arrays 1005a and 1005b and the cylindrical lens 1006 each are arranged such that the curvature is parallel to the width direction. Due to these three lenses, an energy distribution of the laser beam is made uniform in the width direction and, at the same time, the laser beam is contracted in the width direction. Thus, linear laser beam having 2 mm in width is formed at a distance of 1900 mm from the cylindrical lens 1306 toward the front.

A crossed cylindrical lens 1007 is provided at a distance of 2050 mm from the cylindrical lens 1306 toward the front. The first surface of the crossed cylindrical lens 1007 has a curvature in the width direction ($R_1$=95 mm), and has a function of contracting in the width direction the linear laser beam having 2 mm in the width direction. The second surface of the crossed cylindrical lens 1007 has a curvature in the longitudinal direction ($R_2$=7500 mm, preferably, $R_2$=7000 to 8000). The cylindrical lens 1007 is arranged such that 1.5 the curvature is parallel to the width direction. The cylindrical lens has 900 mm in length in the longitudinal direction, 60 mm in length in the width direction, and 30 mm in thickness.

Figure 12:
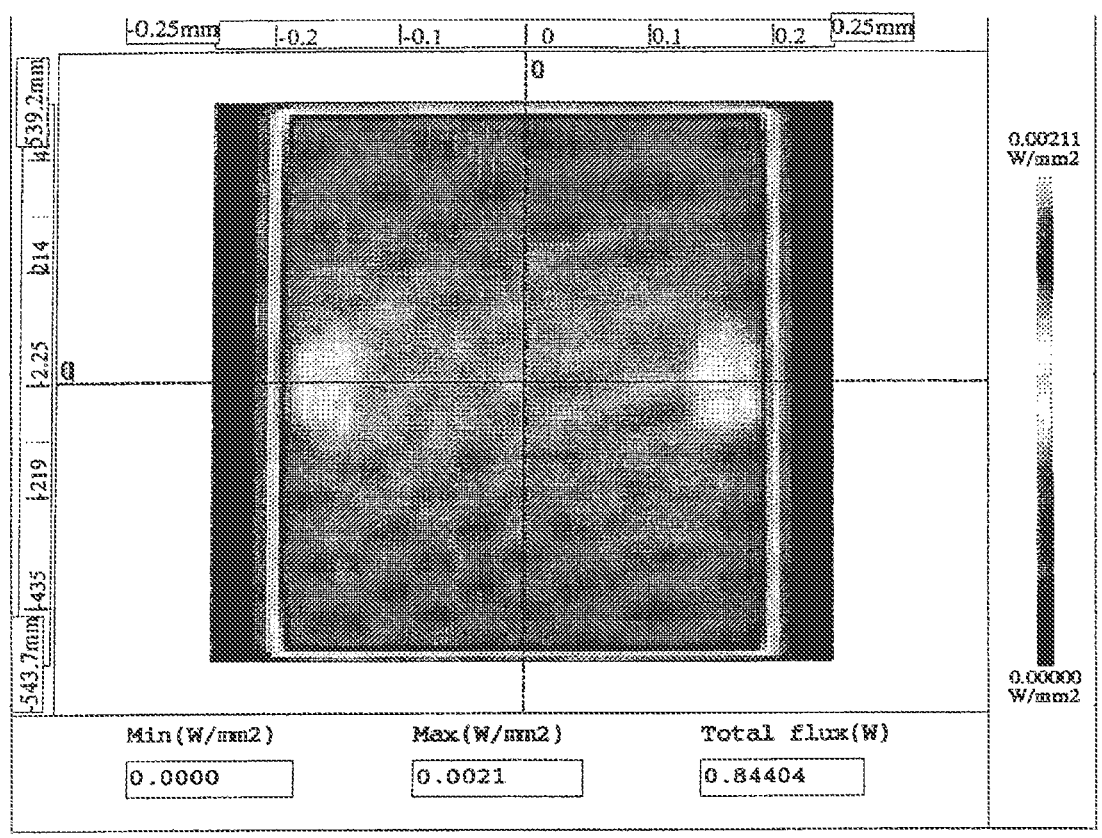
FIG. 12 shows an example of a distribution of laser beam energy which is formed on an irradiation surface in the case where a curvature is provided to a second surface of a lens 1007 in the optical system shown in FIGS. 11A and 11B.
Figure 13:
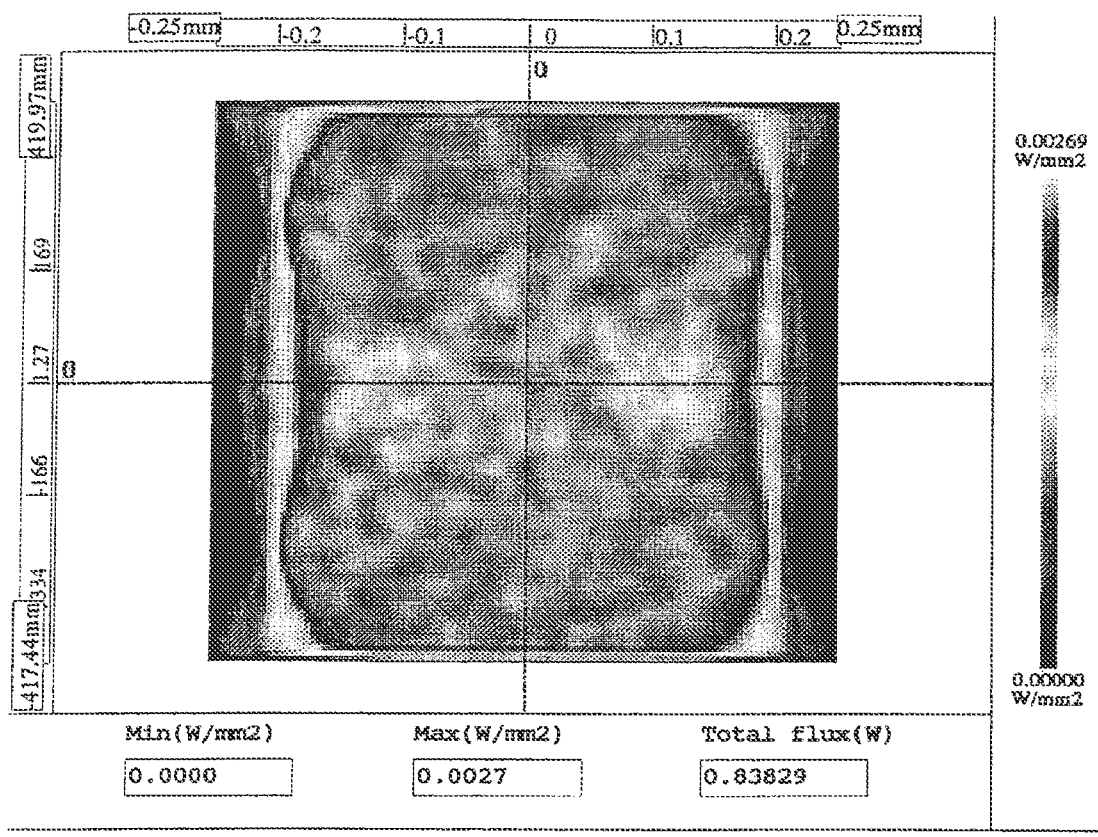
FIG. 13 shows an example of a distribution of laser beam energy which is formed on the irradiation surface in the case where no curvature is provided to the second surface of the lens 1007 in the optical system shown in FIGS. 11A and 11B.

In FIG. 12, the simulation result of an energy distribution of a linear beam that is obtained when a curvature is given to the second surface of the lens 1007 (it is corresponded to that curvature is given to the linear beam in the longitudinal direction) is shown. In FIG. 13, the simulation result of an energy distribution of the linear beam when a curvature is not given to the second surface is shown. In FIGS. 12 and 13, an abscissa axis represents the length of the width direction and an ordinate axis represents the length of the longitudinal direction. It is disclosed that the uniformity of the energy distribution is excellent due to a correspondence of a convergent positions on an irradiation surface as shown in FIG. 12, and that the uniformity of the energy distribution is deteriorated due to a deviation of a convergent portion on an irradiation surface shown in FIG. 13. If both are compared, a linear beam that is made uniform in energy having 100 mm in length can be obtained by using an optical system of the present invention.

Embodiment 4

Figure 14:
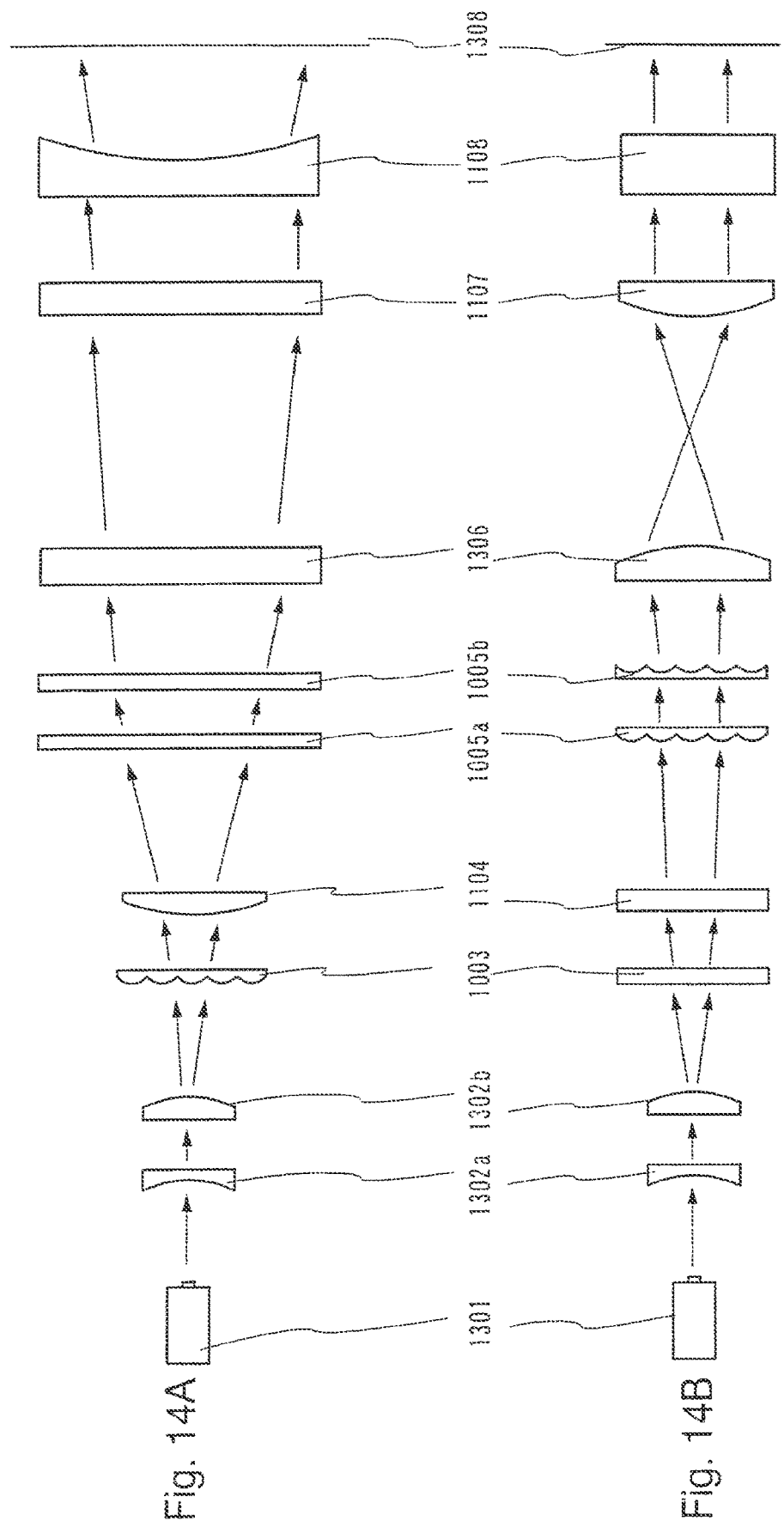
FIGS. 14A and 14B show an example of an optical system which is used for forming a linear beam of 1,000 mm in length in a long-dimension direction.

In this embodiment, an example that a linear laser beam having 1000 mm in length is formed by using an optical system different from that of Embodiment 3 is described. FIG. 14A shows the optical system with a longitudinal direction being viewed perpendicularly and FIG. 14B shows the optical system with a width direction being viewed perpendicularly. With respect to a laser 1301, a beam expanders 1302a, 1302b, a cylindrical array lens 1003, a cylindrical lens arrays 1005a, 1005b, and a cylindrical lens 1306 shown in Embodiment 1, a description thereof are omitted because position and shape thereof are same as shown in Embodiment 3.

The laser beam emitted from the laser 1301 is expanded to be twice as large both in the longitudinal direction and the in the width direction by a beam expanders 1302a and 1302b. The laser beam emitted from the beam expander is incident into a cylindrical lens array 1003 which is located at a distance of 50 mm from the beam expander toward the front. After that, the laser beam is incident into a cylindrical lens 1104 which is located at a distance of 15 mm from the cylindrical lens array 1003 toward the front. The cylindrical lens 1104 is a cylindrical lens having 150 mm in length, 60 mm in width, 20 mm in thickness, $R_1$=2140 mm, and $R_2$=∞. The cylindrical lens arrays 1103 and the cylindrical lens 1104 each are arranged such that the curvature is parallel to the longitudinal direction. Due to these two lenses, the laser beam is made uniform in energy in the longitudinal direction.

The laser beam emitted from the cylindrical lens 1104 is incident into a cylindrical lens array 1005a which is located at a distance of 395 mm from the cylindrical lens 1104 toward the front. After that, the laser beam is transmitted to a cylindrical array 1005b which is located at a distance of 65 mm from the cylindrical array 1005a and is incident into a cylindrical lens 1306 which is located at a distance of 1600 mm from a cylindrical array 1005b toward the front. Due to these three lenses, the laser beam is made uniform in energy in the width direction and, at the same time, the laser beam is contracted. Thus, linear laser beam having 2 mm in the width direction is formed at a distance of 1000 mm from the cylindrical lens 1006 toward the front.

In order to further contract the above linear laser beam having 2 mm in the width direction, a doublet cylindrical lens 1107 is located at a distance of 2050 mm from the cylindrical lens 1306 toward the front. The cylindrical lens 1107 is a cylindrical lens having 900 mm in length, 60 mm in width, 30 mm in thickness, $R_1$=95 mm, and $R_2$=∞, and that is arranged such that the curvature is parallel to the width direction. If there is no existence on the flat surface 1308 at a distance of 224 mm from the cylindrical lens 1107 toward the front, a simulation result of a linear laser beam formed on the flat surface is shown in FIG. 13. According to FIG. 13, widths at the vicinity of the center of the linear beam in the longitudinal direction are wider than the both ends thereof. This indicates that the convergent position is coincident with the irradiation surface. That is, uniformity of the energy distribution is deteriorated.

Figure 15:
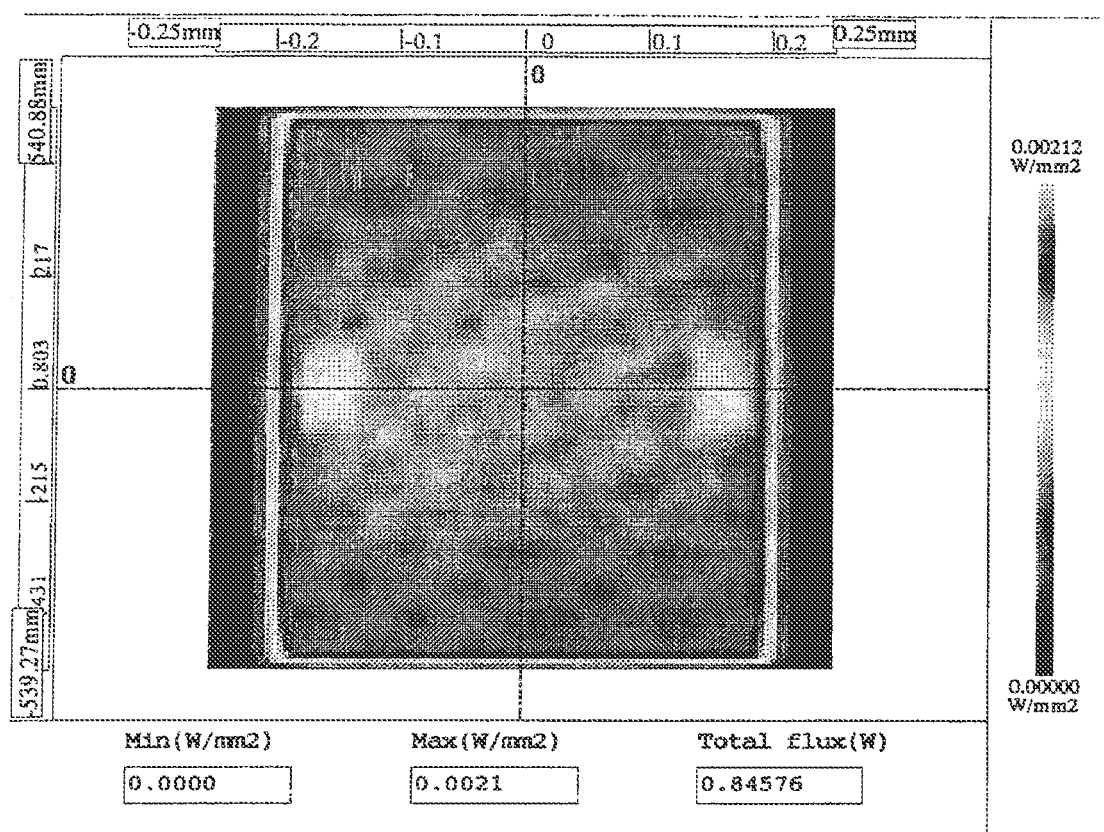
FIG. 15 shows an example of a distribution of laser beam energy which is formed on an irradiation surface by the optical system shown in FIGS. 14A and 14B.

In order to avoid a deviation of a convergent position, a cylindrical lens 1108 is provided at a distance of 44 mm from a cylindrical lens 1107 toward a front. The cylindrical lens 1108 is a cylindrical lens having 60 mm in length, 900 mm in width, 30 mm in thickness, $R_1=\infty$, and $R_2=7000$ mm, and that is arranged such that the curvature is parallel to the longitudinal direction. It is desirable that the $R_2$ be within the range of 7000 to 8000 mm. A simulation result of the produced laser beam by such optical system is shown in FIG. 15. In FIG. 15, an abscissa axis represents the length of the width direction and an ordinate axis represents the length of the longitudinal direction. FIG. 15 is shown that a laser beam on the irradiation surface 1308 having 1000 mm in length and 0.4 mm in width at a distance of 160 mm from a cylindrical lens 1108 toward a front, and that is arranged such that the curvature is parallel to the width direction. This indicates that the convergent position is coincident with the irradiation surface. That is, uniformity of the energy distribution is excellent.

Embodiment 5

In this embodiment, a method of avoiding a deviation of convergent position by adding a cylindrical lens that is different in shape from cylindrical lens in Embodiment 4 is described. FIG. 16A shows the optical system with a longitudinal direction being viewed perpendicularly and FIG. 16B shows the optical system with a width direction being viewed perpendicularly.

Figure 16:
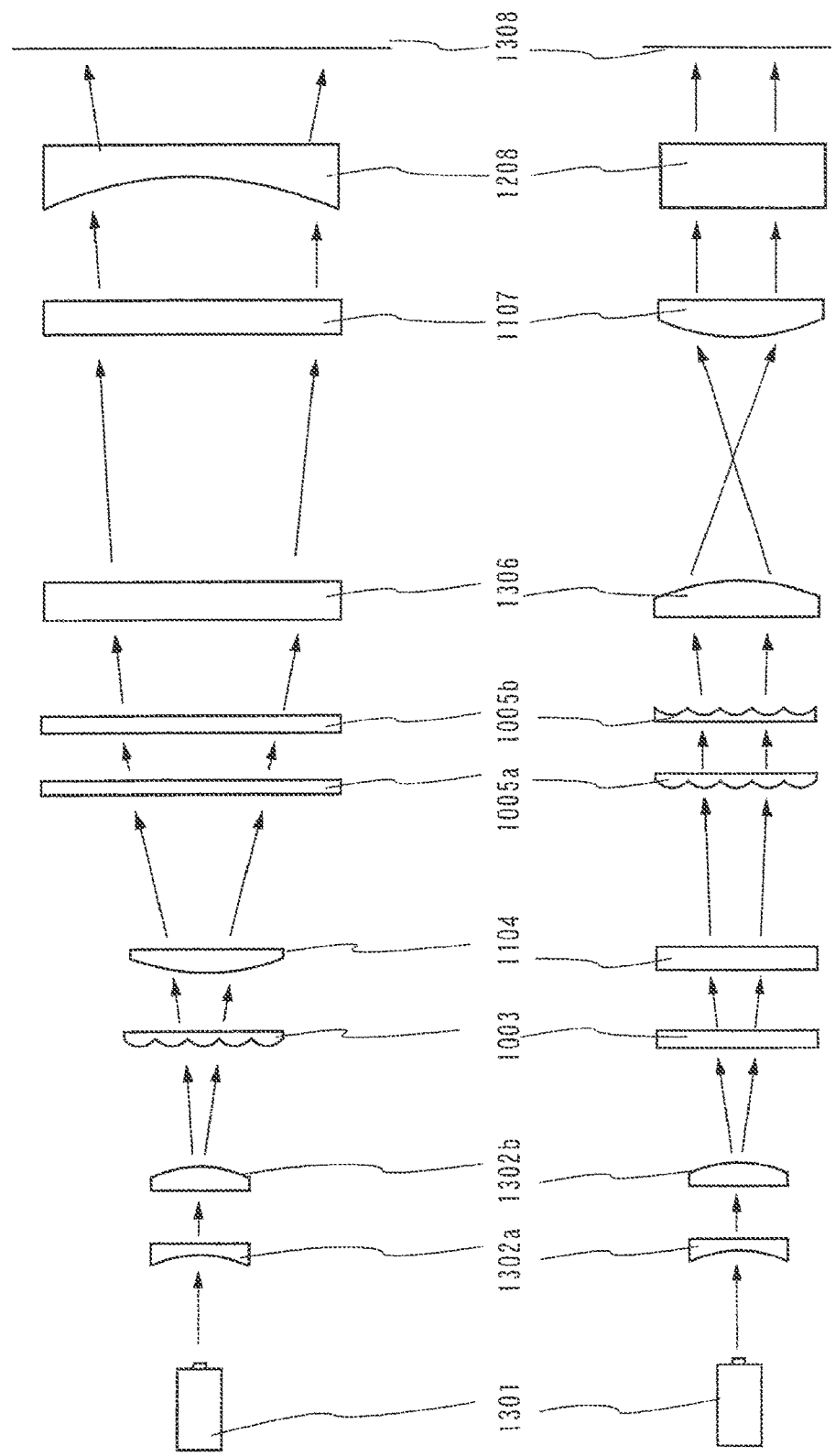
FIGS. 16A and 16B show an example of an optical system which is used for forming a linear beam of 1,000 mm in length in a long-dimension direction.
Figure 17:
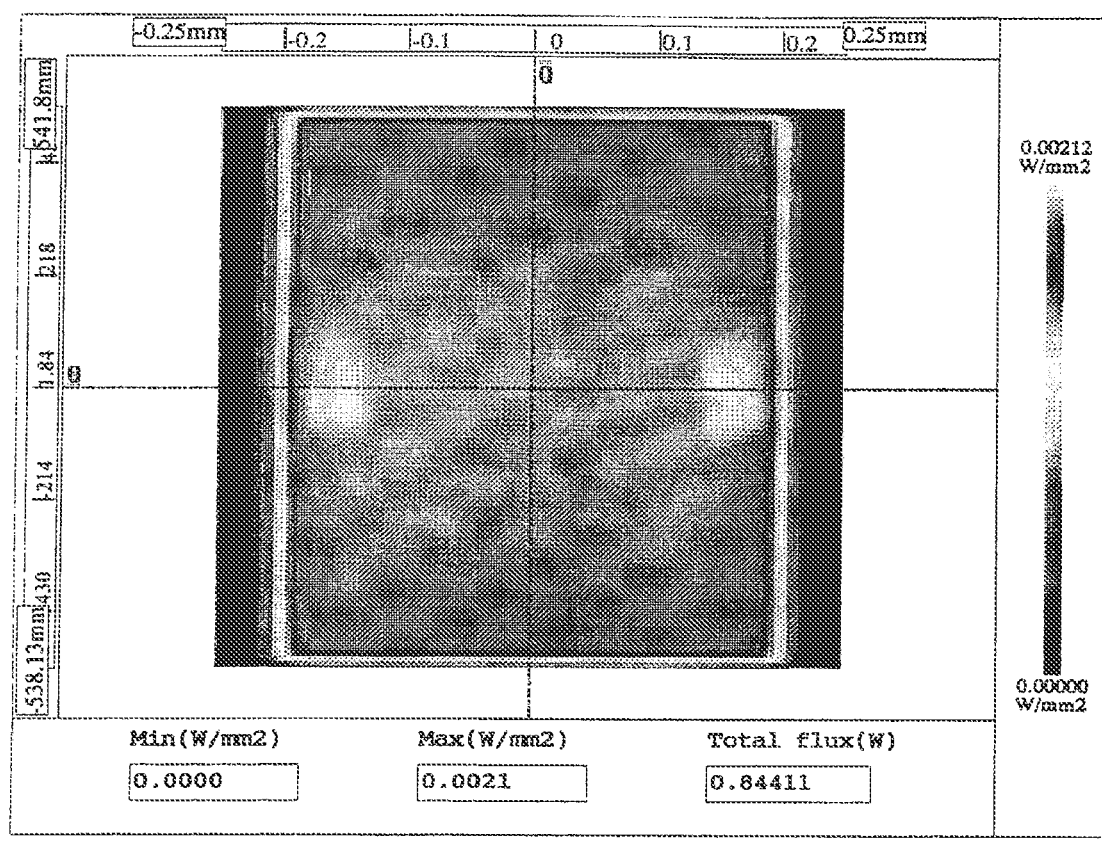
FIG. 17 shows an example of a distribution of laser beam energy which is formed on an irradiation surface by the optical system shown in FIGS. 16A and 16B.

FIG. 16 shows that a cylindrical lens 1108 that is used in an optical system (FIG. 14) shown in Embodiment 3 is exchanged for a cylindrical lens 1208. The cylindrical lens 1208 is a cylindrical lens having 60 mm in length, 900 mm in width, 30 mm in thickness, $R_1=-800$ mm, and $R_2=\infty$, and that is arranged such that the curvature is parallel to the longitudinal direction. It is desirable that the $R_2$ be within the range of −8000 to −7000 mm. A simulation result of the produced laser beam by such optical system is shown in FIG. 17. In FIG. 17, an abscissa axis represents the length of the width direction and an ordinate axis represents the length of the longitudinal direction. FIG. 17 is shown that a linear beam on the irradiation surface 1308 having 1000 mm in length and 0.4 mm in width at a distance of 160 mm from a cylindrical lens 1208 toward a front. In addition, width in the vicinity of the center and at both ends of linear beam in longitudinal direction are the same. This indicates that the convergent position is coincident with the irradiation surface. That is, uniformity of the energy distribution is excellent.

Embodiment 6

In this embodiment, the case where laser annealing is performed on a large area substrate will be described.

Figure 29A:
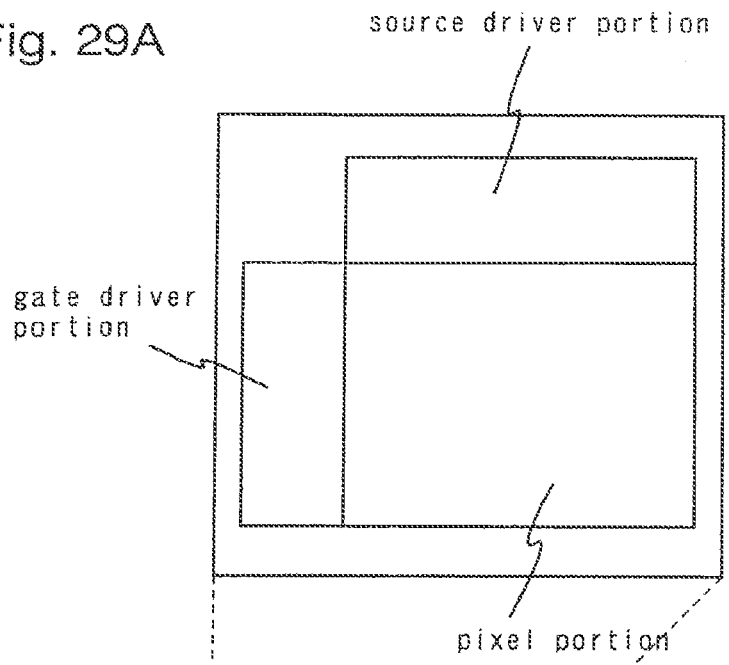
FIGS. 29A and 29B show an example of applying the present invention to a large area substrate.
Figure 29B:
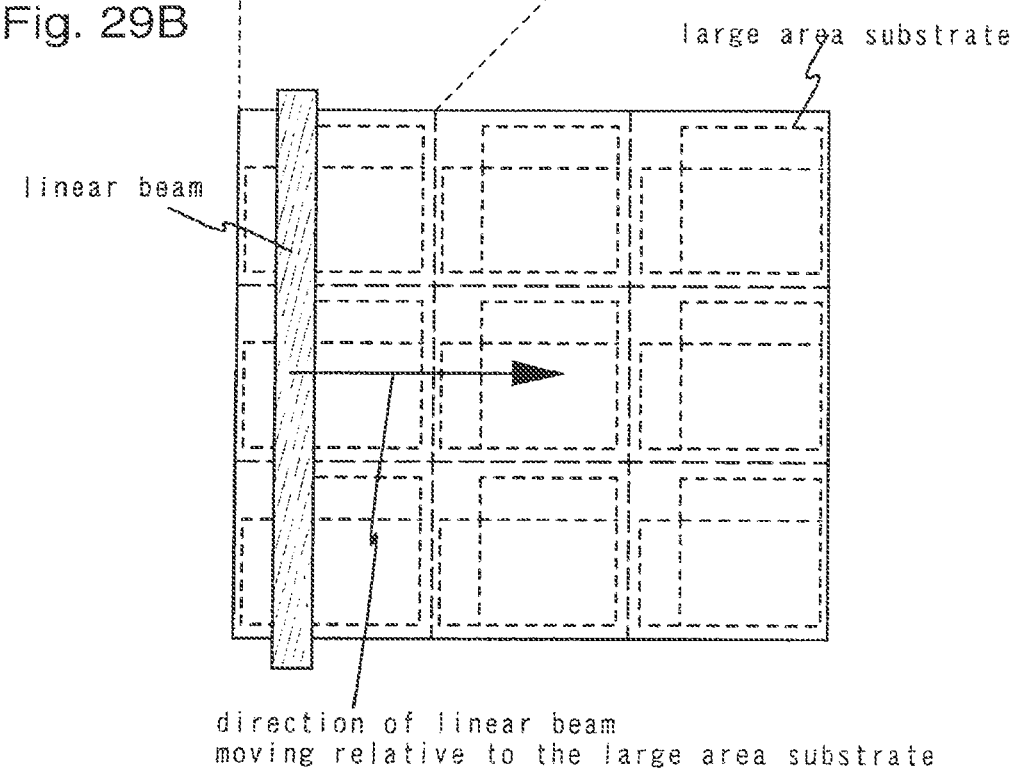

As shown in FIG. 29A, although there is the case where, in an active matrix liquid crystal display device or the like, TFTs for a pixel portion and a driver circuit (a source driver portion and a gate driver portion) are formed on one glass substrate, in order to improve the throughput, there is often the case where the large area substrate is used to form a plurality of a panels for the liquid crystal display device obtained from the large area substrate. Thus, in this embodiment, there will be described a method of forming a linear beam longer than the prior art in a long-dimension direction and irradiating the linear beam to the large area substrate while moving the beam relative to the substrate.

First, in accordance with any one of Embodiments 1 to 5, there is formed the linear beam which is longer than the prior art in the length direction and has a uniform energy distribution on an irradiation surface or a plane in the vicinity thereof. Then, the linear beam is irradiated to the large area substrate while being moved relative to the substrate. At this time, since the linear beam is longer than the prior art in the length direction, annealing can be performed on an entire surface of the large area substrate only by moving the laser beam in one direction with respect to the substrate. It is not necessary to move the laser beam in at least two directions or to irradiate the laser beam plural times, which have been conventionally necessary, thereby remarkably improving the throughput. Also, there is formed no region to which the laser beam is irradiated plural times or no region to which no laser beam is irradiated, whereby it is realized to perform annealing uniformly on the entire surface.

Embodiment 7

In this embodiment, a method of manufacturing an active matrix substrate will be described with reference to FIGS. 18A to 21. A substrate on which a CMOS circuit, a driver circuit, and a pixel portion having a pixel TFT and a storage capacitor are formed together is called active matrix substrate for convenience.

First, a substrate 400 formed of glass such as barium borosilicate glass and aluminum borosilicate is used in this embodiment. The substrate 400 may be a quartz substrate, a silicon substrate, a metal substrate or stainless substrate, which has an insulating film on the surface. The substrate 400 may be a plastic substrate having heat resistance, which can withstands a process temperature in this embodiment. In the present invention, since the linear beam is longer than the prior art in the longitudinal direction and has a uniform energy distribution, annealing can be performed on an entire surface of the large area substrate.

Next, a base film 401 having an insulating film such as silicon oxide film, silicon nitride film, and a silicon oxynitride film is formed on the substrate 400. In this embodiment, a two-layer structure is used for the base film 401. However, a structure may be used where a single layer film, which is the insulating film itself, or at least two layers are stacked.

Next, semiconductor films 402 to 406 are formed on the base film. First, the semiconductor films 402 to 406 are formed with a thickness of 25 to 80 nm (preferably 30 to 60 nm) by a well-known method (such as the sputtering method, LPCVD method, and plasma CVD method). The laser crystallization is performed by irradiating laser beam emitted from a laser to a semiconductor film by applying any of Embodiments 1 to 5. Of course, the laser crystallization can be carried out by combining other known method (such as thermal crystallization method using RTA or a furnace annealing and thermal crystallization method using a metal element facilitating the crystallization). Patterning is performed on the obtained crystalline semiconductor film in a desired form in order to form the semiconductor layers 402 to 406. As the semiconductor films, there are an amorphous semiconductor film, a microcrystalline semiconductor film, and a crystalline semiconductor film. A compound semiconductor film having an amorphous structure such as an amorphous silicon germanium film can be applied.

In this embodiment, plasma CVD method is used to form an amorphous silicon film 55 nm thick. After the dehydrogenation is performed on this amorphous silicon film (at 500° C. for one hour), the laser beam emitted from a continuous oscillation $YVO_4$ laser with output 10 W is converted into the second harmonics by a nonlinear element, and then the rectangle beam is formed by an optical system shown in one of Embodiments 1 to 5 and it irradiates the amorphous silicon film. At this time, about 0.01-100 $MW/cm^2$ (preferably 0.1-10 $MW/cm^2$) is necessary for the energy density. The stage is relatively moved to the laser beam at a speed of about 10-2000 cm/s, and it irradiates, and then the crystalline silicon film is formed. The semiconductor layers 402 to 406 are formed by performing patterning processing thereon by using the photolithography method.

After the semiconductor layers 402 to 406 are formed, a small amount of impurity element (boron or phosphorus) may be doped in order to control a threshold value of the TFT.

Next, a gate insulating film 407 covering the semiconductor layers 402 to 406 is formed. The gate insulating film 407 is formed by using an insulating film 40 to 150 nm thick containing silicon in accordance with plasma CVD method or sputtering method. In this embodiment, a silicon oxynitride film (compositional ratio: Si=32%, O=59%, N=7% and H=2%) with a thickness of 110 nm is formed in accordance with the plasma CVD method. Notably, the gate insulating film is not limited to the silicon oxynitride film but other insulating films containing silicon may be used as a single layer or as a laminated layers.

When a silicon oxide film is used, it is formed by mixing Tetraethyl Orthosilicate (TEOS) and $O_2$ by plasma CVD method, which is discharged under a condition with reaction pressure of 40 Pa, a substrate temperature of 300 to 400° C. and high frequency (13.56 MHz) power density of 0.5 to 0.8 $W/cm^2$. Thermal annealing at 400 to 500° C. thereafter can give good characteristics to the silicon oxide film produced in this way as a gate insulating film.

Next, a first conductive film 408, which is 20 to 100 nm thick, and a second conductive film 409, which is 100 to 400 nm thick, is stacked on the gate insulating film 407. In this embodiment, the first conductive film 408 formed by a TaN film with a thickness of 30 nm and the second conductive film 409 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride ($WF_6$). In both cases, the use of the gate electrode needs low resistance. Therefore, the resistivity of the W film is desirably 20 µΩcm or below.

While, in this embodiment, the first conductive film 408 is TaN and the second conductive film 409 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used.

Next, masks 410 to 415 made of resist are formed by photolithography method, and first etching process is performed thereon in order to form electrodes and wirings. The first etching process is performed under first and second etching conditions (FIG. 18B). The first etching condition in this embodiment is to use Inductively Coupled Plasma (ICP) etching and to use $CF_4$ and $Cl_2$ and $O_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 410 to 415 made of resist. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for about 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased about 10 to 20% more.

In the first etching process, when the form of the resist mask is appropriate, the shape of the ends of the first and the second conductive layers are in the tapered shape due to the effect of the bias voltage applied to the substrate side. The angle of the tapered portion is 15 to 45°. Thus, conductive layers 417 to 422 in a first shape are formed which include the first conductive layers and the second conductive layers (first conductive layers 417a to 422a and second conductive layer 417b to 422b) through the first etching process. Reference numeral 416 is a gate insulating film, and in the gate insulating film 416, an area not covered by the first conductive layers 417 to 422 in first shape is etched by about 20 to 50 nm to form a thinner area.

Next, second etching process is performed without removing masks made of resist (FIG. 18C). Here, $CF_4$, $Cl_2$ and $O_2$ are used to etch the W film selectively. Then, second conductive layers 428b to 433b are formed by the second etching process. On the other hand, the first conductive layers 417a to 422a are hardly etched, and conductive layers 428 to 433 in the second shape are formed.

First doping process is performed without removing masks made of resist and low concentration of impurity element, which gives n-type to the semiconductor layer, is added. The doping process may be performed in accordance with the ion-doping method or the ion-implanting method. The ion doping method is performed under a condition in the dose of $1\times10^{13}$ to $5\times10^{14}$ $cm^2$ and the accelerating voltage of 40 to 80 keV. In this embodiment, the ion doping method is performed under a condition in the dose of $1.5\times10^{13}/cm^2$ and the accelerating voltage of 60 keV. The n-type doping impurity element may be Group 15 elements, typically phosphorus (P) or arsenic (As). Here, phosphorus (P) is used. In this case, the conductive layers 428 to 433 function as masks for the n-type doping impurity element. Therefore, impurity regions 423 to 427 are formed in the self-alignment manner. An n-type doping impurity element in the concentration range of $1\times10^{18}$ to $1\times10^{20}/cm^3$ are added to the impurity regions 423 to 427.

When masks made of resist are removed, new masks 434a to 434c made of resist are formed. Then, second doping process is performed by using higher accelerating voltage than that used in the first doping process. The ion doping method is performed under a condition in the dose of $1\times10^{13}$ to $1\times10^{15}/cm^2$ and the accelerating voltage of 60 to 120 keV. In the doping process, the second conductive layers 428b to 432b are used as masks against the impurity element. Doping is performed such that the impurity element can be added to the semiconductor layer at the bottom of the tapered portion of the first conductive layer. Then, third duping process is performed by having lower accelerating voltage than that in the second doping process to obtain a condition shown in FIG. 19A. The ion doping method is performed under a condition in the dose of $1 \times 10^{15}$ to $1 \times 10^{17}/cm^2$ and the accelerating voltage of 50 to 100 keV. Through the second doping process and the third doping process, an n-type doping impurity element in the concentration range of $1 \times 10^{18}$ to $5 \times 10^{19}/cm^3$ is added to the low concentration impurity region 436, 442 and 448, which overlap with the first conductive layer. An n-type doping impurity element in the concentration range of $1 \times 10^{19}$ to $5 \times 10^{21}/cm^3$ is added to the high concentration impurity regions 435, 441, 444 and 447.

With proper accelerating voltage, the low concentration impurity region and the high concentration impurity region can be formed by one doping process, not by separately performing the second doping process and the third doping process.

Next, after removing masks made of resist, new masks 450a to 450c made of resist are formed to perform the fourth doping process. Through the fourth doping process, impurity regions 453, 454, 459 and 460, to which an impurity element doping a conductive type opposite to the one conductive type is added, in a semiconductor layer, which is an active layer of a p-channel type TFT. Second conductive layers 428a to 432a are used as mask against the impurity element, and the impurity element giving p-type is added so as to form impurity regions in the self-alignment manner. In this embodiment, the impurity regions 453, 454, 459 and 460 are formed by applying ion-doping method using diborane ($B_2H_6$) (FIG. 19B). During the fourth doping process, the semiconductor layer forming the n-channel type TFT is covered by masks 450a to 450c made of resist. Thorough the first to the third doping process, phosphorus of different densities is added to each of the impurity regions 439, 447 and 448. Doping process is performed such that the concentration of p-type doping impurity element can be $1 \times 10^{19}$ to $5 \times 10^{21}$ atoms/$cm^3$ in both regions. Thus, no problems are caused when they function as the source region and the drain region of the p-channel type TFT.

Impurity regions are formed in the semiconductor layers, respectively, through the processes above.

Next, the masks 450a to 450c made of resist are removed and a first interlayer insulating film 461 is formed thereon. The first interlayer insulating film 461 may be an insulating film containing silicon with a thickness of 100 to 200 nm, which is formed by plasma CVD method or sputtering method. In this embodiment, silicon oxynitride film with a thickness of 150 nm is formed by plasma CVD method. The first interlayer insulating film 461 is not limited to the silicon oxynitride film but may be the other insulating film containing silicon in a single layer or in a laminated layers.

Next, as shown in FIG. 19C, a recovery of crystallization of a semiconductor layer and an activation of impurity elements added to the respective semiconductor layers are performed by irradiating a laser beam. At this time, energy density of the laser beam is necessary about 0.01-100 MW/$cm^2$ (Preferably 0.01-10 MW/$cm^2$), and moves the substrate to the laser beam relatively at the speed of 10-2000 MW/$cm^2$. Besides laser annealing method, thermal annealing method or rapid thermal annealing method (RTA method) and the like can be applied.

Alternatively, the activation treatment may be performed before the first interlayer insulating film is formed. However, when a wiring material in use is sensitive to heat, the activation process is preferably performed after an interlayer insulating film (insulating film mainly containing silicon such as silicon nitride film) for protecting the wirings etc. like this embodiment.

After the heating process (thermal process at 300 to 550° C. for 1 to 12 hours) is performed, hydrogenation can be performed. This process terminates the dangling bond of the semiconductor layer with hydrogen contained in the first interlayer insulating film 461. The semiconductor layer can be hydrogenated regardless of the existence of the first interlayer insulating film. Alternatively, the hydrogenation may be plasma hydrogenation (using hydrogen excited by plasma) or heating process in an atmosphere containing 3 to 100% of hydrogen at 300 to 450° C. for 1 to 12 hours.

Next, a second interlayer insulating film 462 formed by an inorganic insulating material or an organic insulating material is formed on the first interlayer insulating film 461. In this embodiment, an acrylic resin film with a thickness of 1.6 μm is formed, whose viscosity is 10 to 1000 cp, preferably 40 to 200 cp and which has depressions and projections formed on the surface.

In this embodiment, in order to prevent mirror reflection, a second interlayer insulating film having projections and depressions on the surface is formed. Thus, the projections and depressions are formed on the surface of the pixel electrode. In order to obtain an effect of light deviation by forming the depressions and projections on the surface of the pixel electrode, a projecting portion may be formed under the pixel electrode. In this case, the projecting portion can be formed by using the same photomask for forming a TFT. Thus, the projecting portion can be formed without any increase in the number of steps. The projecting portion may be provided as necessary on the substrate in the pixel portion except for wirings and the TFT portion. Accordingly, projections and depressions can be formed on the surface of the pixel electrode along the projections and depressions formed on the surface of an insulating film covering the projecting portion.

Alternatively, the second interlayer insulating film 462 may be a film having a flattened surface. In this case, after the pixel electrode is formed, projections and depressions are formed on the surface by performing an added process such as well-known sandblast method and etching method. Preferably, by preventing mirror reflection and by dispersing reflected light, the whiteness is increased.

Figure 20:
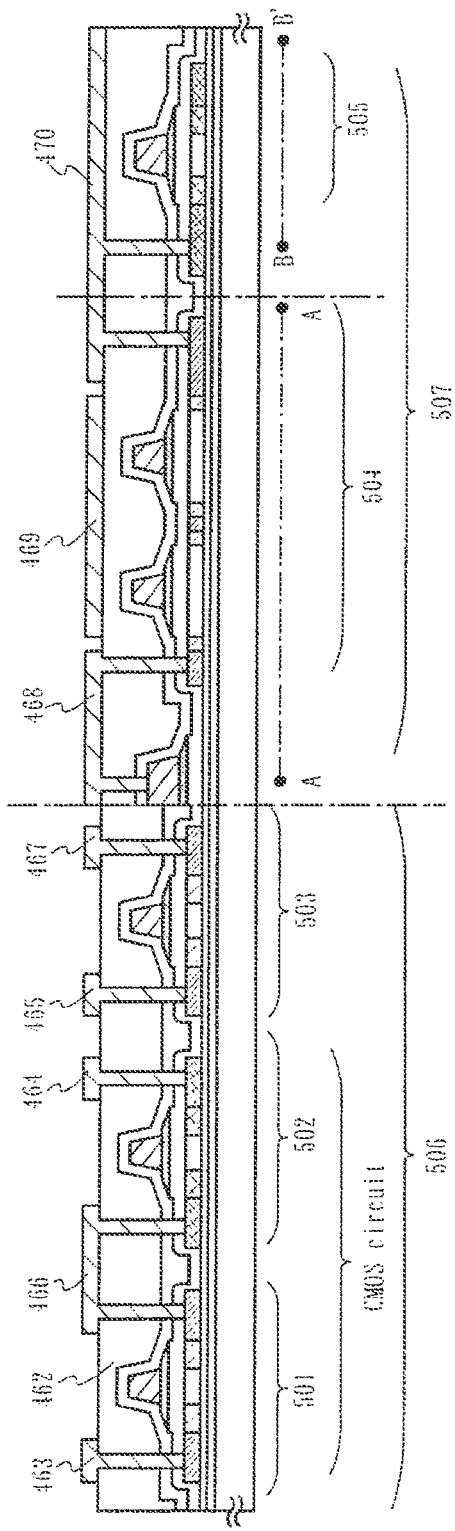
FIG. 20 is a cross-sectional view showing a manufacturing process of the pixel TFT and the TFT of the driver circuit.

Wirings 464 to 468 electrically connecting to impurity regions, respectively, are formed in a driver circuit 506. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate layers including three or more layers. The materials of the wirings are not limited to Al and Ti. For example, the wiring can be formed by forming Al or Cu on a TaN film and then by patterning the laminate film in which a Ti film is formed (FIG. 20).

In a pixel portion 507, a pixel electrode 470, a gate wiring 469 and a connecting electrode 468 are formed. Source wirings (a laminate of layers 443a and 443b) are electrically connected with a pixel TFT by the connecting electrode 468. The gate wiring 469 is electrically connected with a gate electrode of the pixel TFT. A pixel electrode 470 is electrically connected with a drain region 442 of the pixel TFT. Furthermore, the pixel electrode 470 is electrically connected with a semiconductor layer 458 functioning as one electrode forming a storage capacitor. Desirably, a material having excellent reflectivity such as a film mainly containing Al or Ag or the laminate film is used for the pixel electrode 470.

In this way, the driver circuit 506 having a CMOS circuit including an n-channel type TFT 501 and a p-channel type TFT 502 and a n-channel type TFT 503, and the pixel portion 507 having the pixel TFT 504 and the storage capacitor 505 can be formed on the same substrate. Thus, an active matrix substrate is completed.

The n-channel type TFT 501 of the drive circuit 506 has a channel forming region 437, a low concentration impurity region 436 overlapping with the first conductive layer 428*a*, which constructs a part of the gate electrode, (GOLD region), and a high concentration impurity region 452 functioning as the source region or the drain region. The p-channel type TFT 502 forming a CMOS circuit together with the n-channel TFT 501, which are connected by an electrode 466, has a channel forming region 440, a high concentration impurity region 453 functioning as the source region or the drain region, and an impurity region 454 to which a p-type doping impurity element are implanted. The n-channel type TFT 503 has a channel forming region 443, a low concentration impurity region 442 overlapping with the first conductive layer 430*a*, which constructs a part of the gate electrode, (GOLD region), and a high concentration impurity region 456 functioning as the source region or the drain region.

The pixel TFT 504 of the pixel portion has a channel forming region 446, a low concentration impurity region 445 formed outside of the gate electrode (LDD region), and a high concentration impurity region 458 functioning as the source region or the drain region. An n-type doping impurity element and a p-type doping impurity element are added to a semiconductor layer functioning as one electrode of the storage capacitor 505. The storage capacitor 505 is formed by an electrode (a laminate of layers 432*a* and 432*b*) and a semiconductor layer by using the insulating film 416 as a dielectric.

The pixel structure in this embodiment is arranged such that light can be blocked in a space between pixel electrodes and the ends of the pixel electrodes can overlap with the source wiring without using the black matrix.

Figure 21:
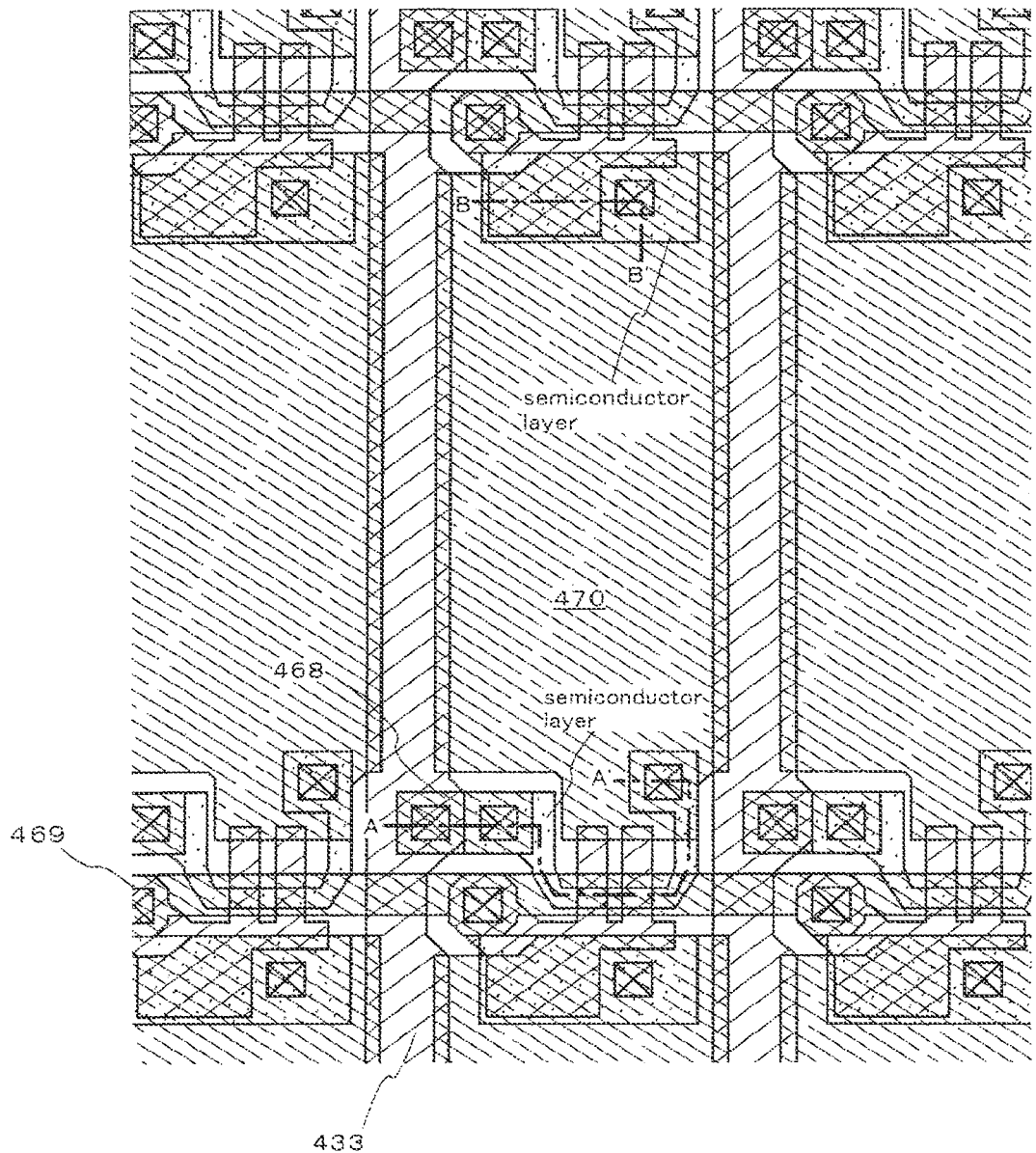
FIG. 21 is a top view showing a structure of a pixel TFT.

FIG. 21 shows a top view of the pixel portion of the active matrix substrate manufactured in this embodiment. The same reference numerals are used for the corresponding parts in FIGS. 18 to 21. A broken line A-A' in FIG. 20 corresponds to a sectional view taken along a broken line A-A' in FIG. 21. A broken line B-B' in FIG. 20 corresponds to a sectional view taken along a broken line B-B' in FIG. 21.

Embodiment 8

Figure 22:
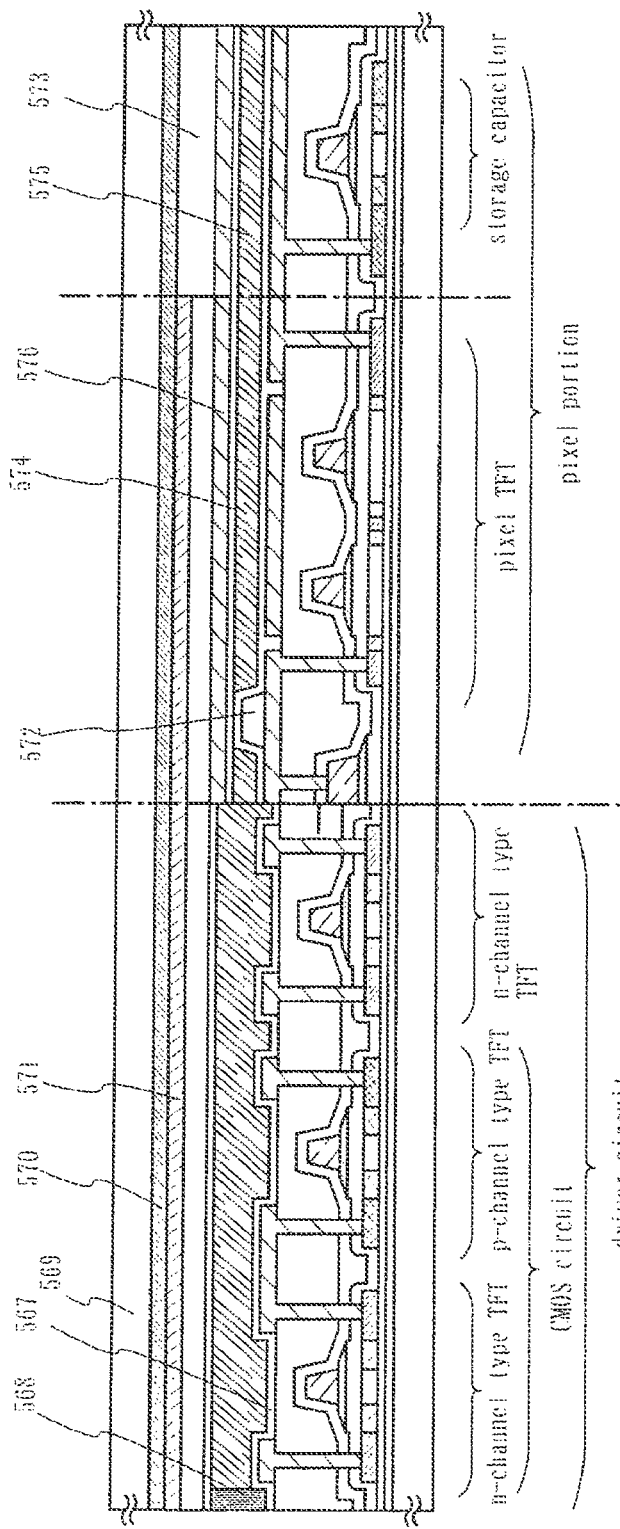
FIG. 22 is a cross-sectional view of an active matrix liquid crystal display device.

This embodiment explains, below, a process to manufacture a reflection type liquid crystal display device from the active matrix substrate made in Embodiment 7, using FIG. 22.

First, after obtaining an active matrix substrate in the state of FIG. 20 according to the Embodiment 7, an alignment film 567 is formed at least on the pixel electrodes 470 on the active matrix substrate of FIG. 20 and subjected to a rubbing process. Incidentally, in this embodiment, prior to forming the alignment film 567, an organic resin film such as an acryl resin film is patterned to form columnar spacers 572 in a desired position to support the substrates with spacing. Meanwhile, spherical spacers, in place of the columnar spacers, may be distributed over the entire surface of the substrate.

Then, a counter substrate 569 is prepared. Then, a coloring layer 570, 571 and a planarizing film 573 are formed on the counter substrate 569. A shade portion is formed by overlapping a red coloring layer 570 and a blue coloring layer 571 together. Meanwhile, the shade portion may be formed by partly overlapping a red coloring layer and a green coloring layer.

In this embodiment is used a substrate shown in the Embodiment 7. Accordingly, in FIG. 21 showing a top view of the pixel portion of the Embodiment 7, there is a need to shade at least the gap between the gate wiring 469 and the pixel electrode 470, the gap between the gate wiring 469 and the connecting electrode 468 and the gap between the connecting electrode 468 and the pixel electrode 470. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 576 of a transparent conductive film is formed on the planarizing film 573 at least in the pixel portion. An alignment film 574 is formed over the entire surface of the counter substrate and subjected to a rubbing process.

Then, the active matrix substrate formed with the pixel portion and driver circuit and the counter substrate are bonded together by a sealing member 568. The sealing member 568 is mixed with filler so that the filler and the columnar spacers bond together the two substrates through an even spacing. Thereafter, a liquid crystal material 575 is poured between the substrates, and completely sealed by a sealing member (not shown). The liquid crystal material 575 may be a known liquid crystal material. In this manner, completed is a reflection type liquid crystal display device shown in FIG. 22. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured by the active matrix substrate including the above-mentioned semiconductor film can have a good operational characteristic and a high reliability. Thus, the liquid crystal display device as above can be used as a display portion for an electronic equipment in various kinds.

Incidentally, this embodiment can be freely combined with any one of Embodiments 1 to 7.

Embodiment 9

This embodiment explains an example of a light-emitting device manufactured by using the method of making TFT when an active matrix substrate shown in embodiment 5 is made. In this specification, the light-emitting device is a general term for the display panel having light-emitting elements formed on a substrate scaled between the substrate and a cover member, and the display module having a TFT mounted on the display panel. Incidentally, the light-emitting element has a layer including an organic compound that electroluminescence caused is obtained by applying an electric field (light-emitting layer), an anode and a cathode. Meanwhile, the electroluminescence in organic compound includes the light emission (fluorescent light) upon returning from the singlet-excited state to the ground state and the light emission (phosphorous light) upon returning from the triplet-excited state to the ground state, including any or both of light emission.

In this specification, all layers formed between the anode and the cathode in the light-emitting element are defined as the organic light-emitting layer. The light-emitting layer, the hole injection layer, the electronic injection layer, the hole transportation layer, and the electronic transportation layer, etc. are concretely included in the organic light-emitting layer. The light-emitting element basically has the structure that the anode layer, the light-emitting layer, and the cathode layer are sequentially laminated. The structures laminated in order of the anode layer, the hole injection layer, the light-emitting layer, the cathode layer, the anode layer, the hole injection layer, the light-emitting layer, the electronic transportation layer, and the cathode layer, etc. in addition to this structure are occasionally possessed.

Figure 23:
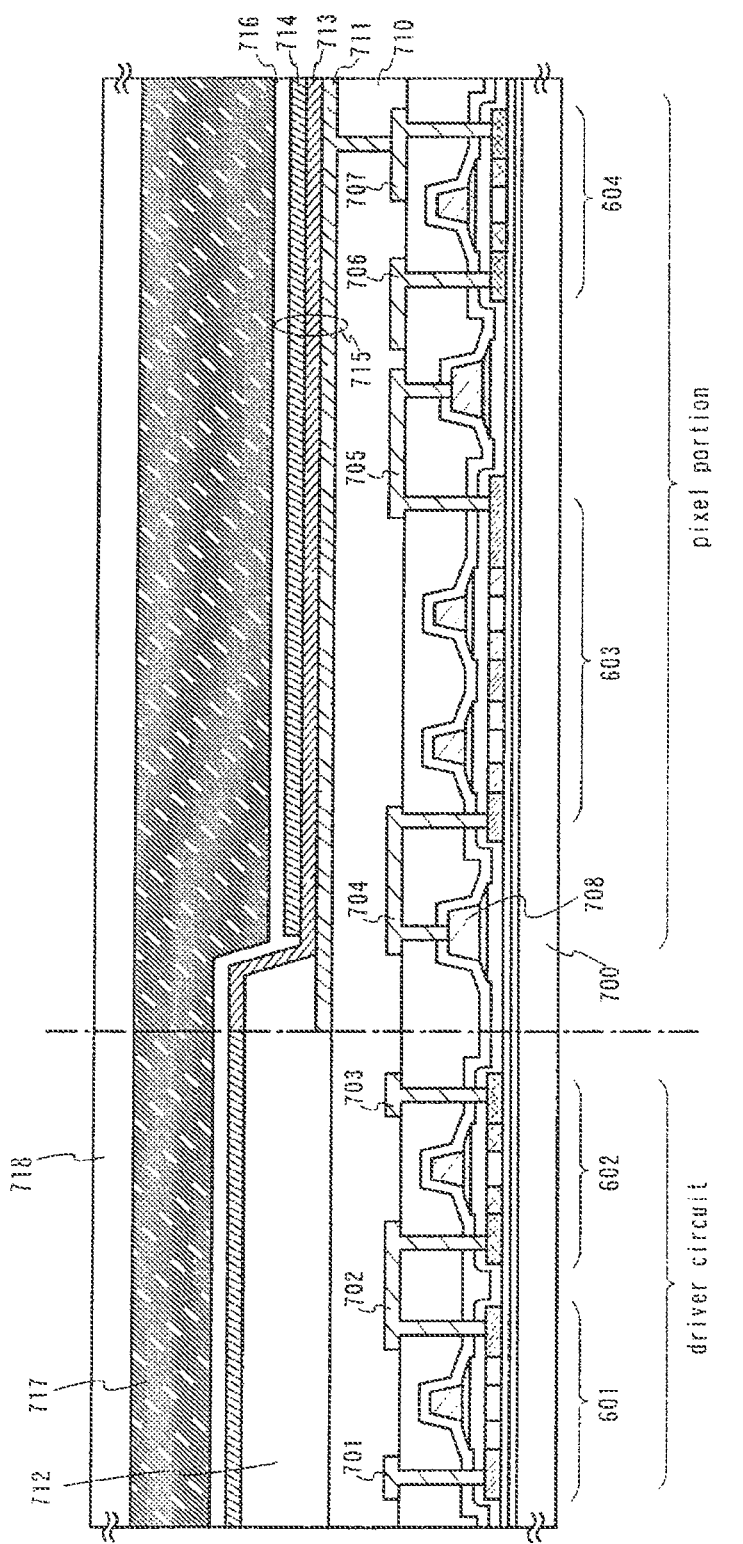
FIG. 23 is a cross-sectional view showing a structure of a driver circuit and a pixel portion of a light-emitting device.

FIG. 23 is a sectional view of a light-emitting device of this embodiment. In FIG. 23, the switching TFT 603 provided on the substrate 700 is formed by using the n-channel TFT 503 of FIG. 20. Consequently, concerning the explanation of the structure, it is satisfactory to refer the explanation on the n-channel TFT 503.

Incidentally, although this example is of a double gate structure formed with two channel regions, it is possible to use a single gate structure formed with one channel region or a triple gate structure formed with three.

The driver circuit provided on the substrate 700 is formed by using the CMOS circuit of FIG. 20. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 20. Consequently, concerning the explanation of the structure, it is satisfactory to refer to the explanation on the n-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711 by being overlaid a pixel electrode 711 of the current control TFT.

Meanwhile, 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 23. The bank 712 may be formed by patterning an insulating film or organic resin film containing silicon having 100-400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1\times10^6 1\times10^{12}\Omega m$ (preferably $1\times10^8 1\times10^{10}\Omega m$).

A light-emitting layer 713 is formed on the pixel electrode 711. Incidentally, although FIG. 23 shows only one pixel, this embodiment separately forms light-emitting layers correspondingly to the respective colors of R (red), G (green) and B (blue). Meanwhile, in this embodiment is formed a low molecular weight organic electroluminescent material by the deposition process. Specifically, this is a lamination structure having a copper phthalocyanine (CuPc) film provided in a thickness of 20 nm as a hole injecting layer and a tris-8-quinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic electroluminescent material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this embodiment was shown the example in which a low molecular weight organic electroluminescent material is used for a light-emitting layer, it is possible to use an intermediate molecular weight organic electroluminescent material and a high molecular weight organic electroluminescent material In this specification, an intermediate molecular weight organic electroluminescent materials is defined that an aggregate of an organic compound which does not have subliming property or dissolving property (preferably, an aggregate which has molecularity of 10 or less), or an organic compound which has a molecular chain length of 5 μm or less (preferably 50 nm or less). For an example of using the high molecular weight organic electroluminescent material, a polythiophene (PEDOT) film of 20 nm is formed by the spin coating method as a hole injection layer and the lamination structure installing paraphenylenvinylene of about 100 nm on it as a light-emitting layer may be good. The luminescence wave length can be selected from red to blue by using the n conjugated high molecular of PPV. Meanwhile, it is possible to use an inorganic material such as silicon carbide for an electron transporting layer or charge injecting layer. These organic electroluminescent materials or inorganic materials can be a known material.

Next, a cathode 714 of a conductive film is provided on the light-emitting layer 713. In this embodiment, as the conductive film is used an alloy film of aluminum and lithium. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon nitride oxide film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light-emitting layer 713 low in heat resistance. Meanwhile, the DLC film, having a high blocking effect to oxygen, can suppress the light-emitting layer 713 from oxidizing. Consequently, prevented is the problem of oxidation in the light-emitting layer 713 during the following seal process.

Furthermore, a seal member 717 is provided on the passivation film 716 to bond a cover member 718. For the seal member 717 used may be an ultraviolet-ray-set resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 23. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFT 601, p-channel TFT 602, a switching TFT (n-channel TFT) 603 and a current control TFT (p-channel TFT) 604 on the substrate 700.

Furthermore, as was explained using FIG. 23, by providing an impurity region overlapped with the gate electrode through an insulating film, it is possible to form an n-channel TFT resistive to the deterioration resulting from hot-carrier effect. Consequently, a reliable light-emitting device can be realized.

Meanwhile, this example shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

The luminescence device made by the above-mentioned method has TFT formed by using the semiconductor film thoroughly annealed, because it is irradiated the laser beam with a very excellent uniformity of the energy distribution. Therefore, the above-mentioned light-emitting device is obtained enough operation characteristic and reliability. Such a light-emitting device can be used as display portions of various electronic equipment.

This embodiment can be properly combined with Embodiments 1 to 7.

Embodiment 10

Various semiconductor devices (active matrix type liquid crystal display device, active matrix type light-emitting device or active matrix type EC display device) can be formed by applying the present invention. Specifically, the present invention can be embodied in electronic equipment of any type in which such an electro optical device is incorporated in a display portion.

Such electronic equipment is a video camera, a digital camera, a projector, a head-mounted display (goggle type display), a car navigation system, a car stereo, a personal computer, or a mobile information terminal (such as a mobile computer, a mobile telephone or an electronic book). FIGS. 24, 25 and 26 show one of its examples.

Figure 24A:
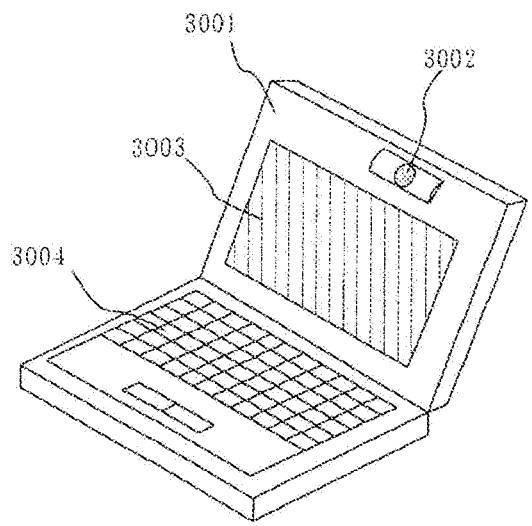
FIGS. 24A to 24F show examples of a semiconductor device.

FIG. 24A shows a personal computer which includes a main body 3001, an image input portion 3002, a display portion 3003, a keyboard 3004 and the like. The invention can be applied to the display portion 3003.

Figure 24B:
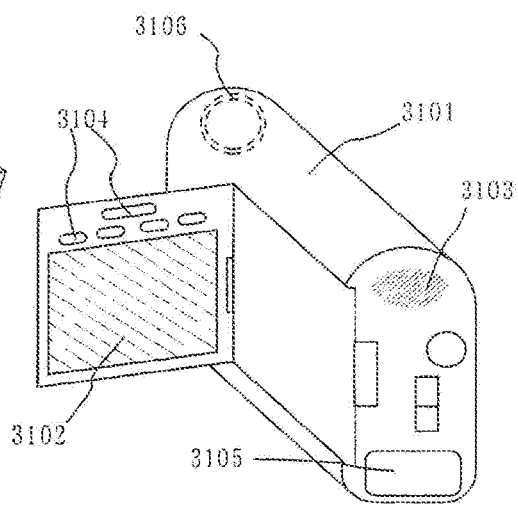

FIG. 24B shows a video camera which includes a main body 3101, a display portion 3102, a sound input portion 3103, operating switches 3104, a battery 3105, an image receiving portion 3106 and the like. The invention can be applied to the display portion 3102.

Figure 24C:
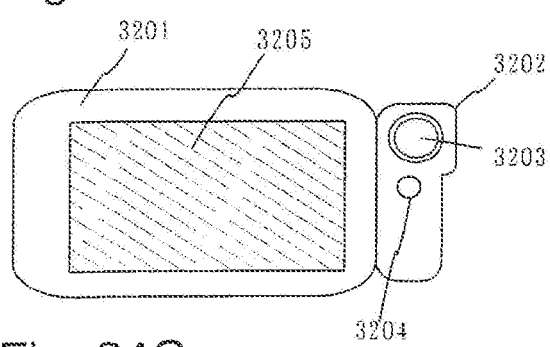

FIG. 24C shows a mobile computer which includes a main body 3201, a camera portion 3202, an image receiving portion 3203, an operating switch 3204, a display portion 3205 and the like. The invention can be applied to the display portion 3205.

Figure 24D:
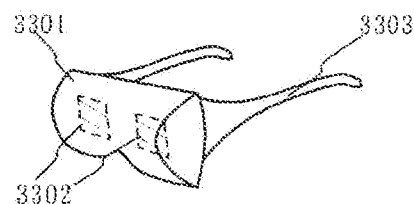

FIG. 24D shows a goggle type display which includes a main body 3301, a display portion 3302, arm portions 3303 and the like. The invention can be applied to the display portion 3302.

Figure 24E:
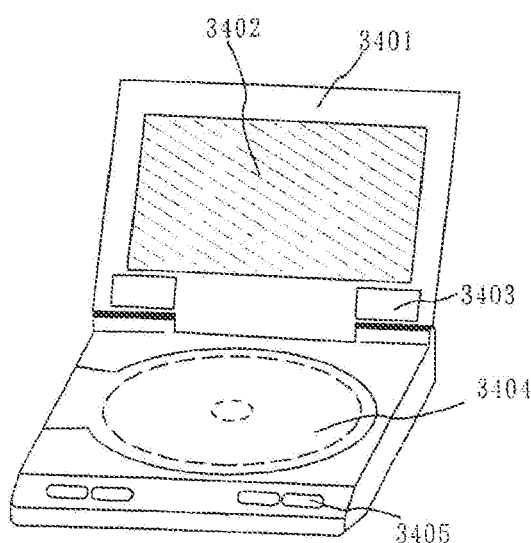

FIG. 24E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The invention can be applied to the display portion 3402.

Figure 24F:
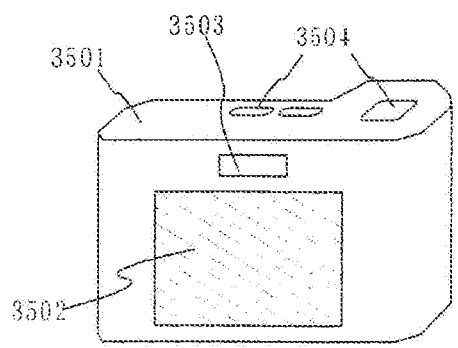

FIG. 24F shows a digital camera which includes a body 3501, a display portion 3502, an eyepiece portion 3503, operating switches 3504, an image receiving portion (not shown) and the like. The invention can be applied to the display portion 3502.

Figure 25A:
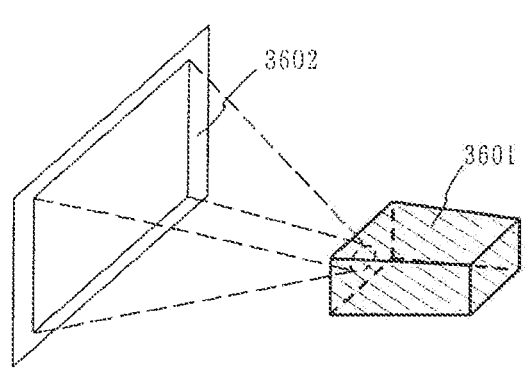
FIGS. 25A to 25D show examples of a semiconductor device.

FIG. 25A shows a front type projector which includes a projection device 3601, a screen 3602 and the like. The invention can be applied to a liquid crystal display device 3808 which constitutes a part of the projection device 3601 as well as other driver circuits.

Figure 25B:
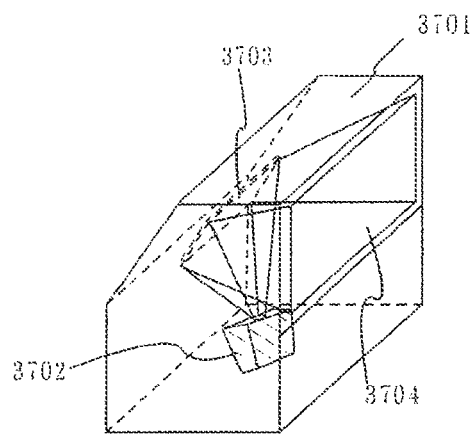

FIG. 25B shows a rear type projector which includes a main body 3701, a projection device 3702, a mirror 3703, a screen 3704 and the like. The invention can be applied to the liquid crystal display device 3808 which constitutes a part of the projection device 3702 as well as other driver circuits.

Figure 25C:
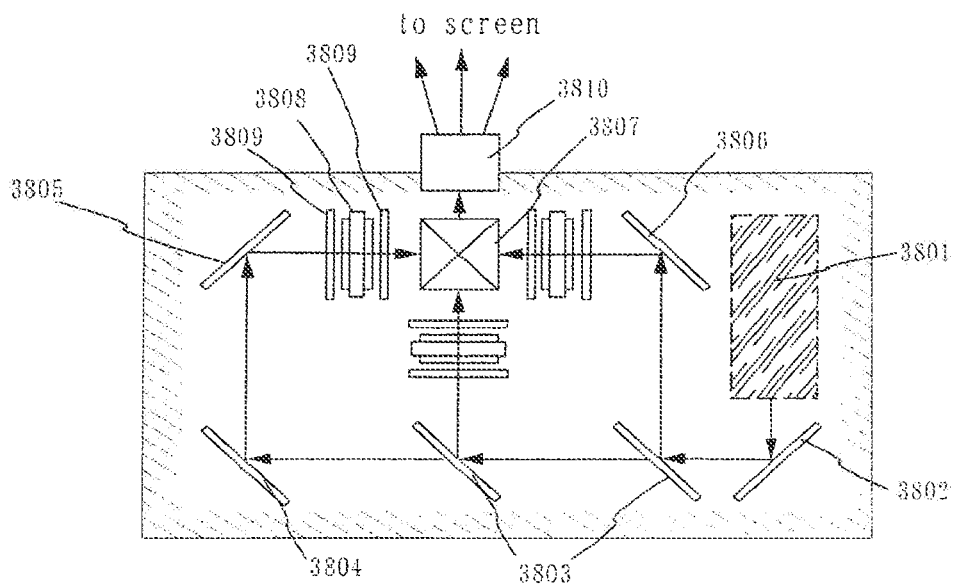

FIG. 25C shows one example of the structure of each of the projection devices 3601 and 3702 which are respectively shown in FIGS. 25A and 25B. Each of the projection devices 3601 and 3702 is made of a light source optical system 3801, mirrors 3802 and 3804-3806, a dichroic mirror 3803, a prism 3807, a liquid crystal display device 3808, a phase difference plate 3809 and a projection optical system 3810.

The projection optical system 3810 is made of an optical system including a projection lens. Embodiment 10 is an example of a three-plate type, but it is not limited to this example and may also be of a single-plate type. In addition, those who embody the invention may appropriately dispose an optical system such as an optical lens, a film having a polarization function, a film for adjusting phase difference or an IR film in the path indicated by arrows in FIG. 25C.

Figure 25D:
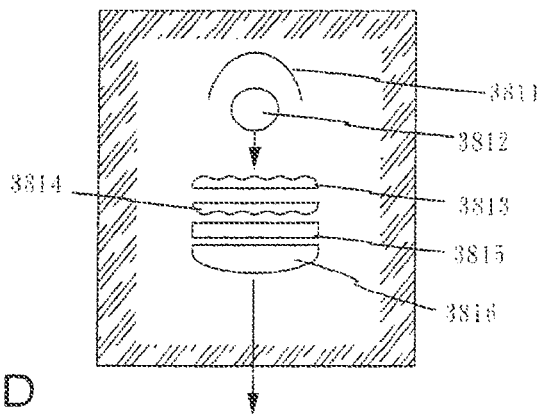

FIG. 25D is a view showing one example of the structure of the light source optical system 3801 shown in FIG. 25C. In Embodiment 10, the light source optical system 3801 is made of a reflector 3811, a light source 3812, lens arrays 3813 and 3814, a polarizing conversion element 3815 and a condenser lens 3816. Incidentally, the light source optical system shown in FIG. 25D is one example, and the invention is not particularly limited to the shown construction. For example, those whose embody the invention may appropriately dispose an optical system such as an optical lens, a film having a polarization function, a film for adjusting phase difference or an IR film.

The projector shown in FIGS. 25A to 25D is of the type using a transparent type of electro optical device, but there is not shown an example in which the invention is applied to a reflection type of electro optical device and a light-emitting device.

Figure 26A:
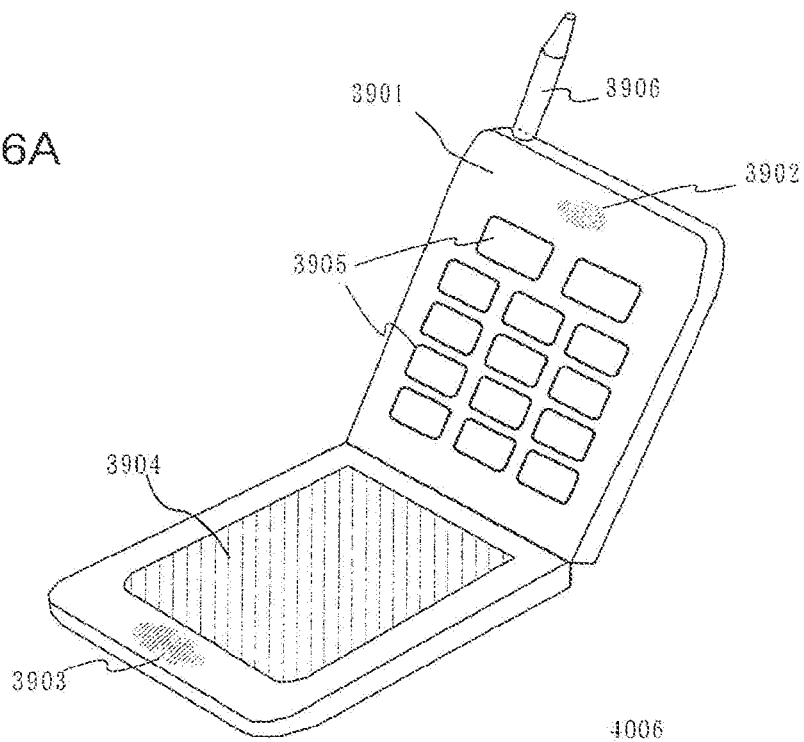
FIGS. 26A to 26C show examples of a semiconductor device.

FIG. 26A shows a mobile telephone which includes a main body 3901, a sound output portion 3902, a sound input portion 3903, a display portion 3904, operating switches 3905, an antenna 3906 and the like. The invention can be applied to the display portion 3904.

Figure 26B:
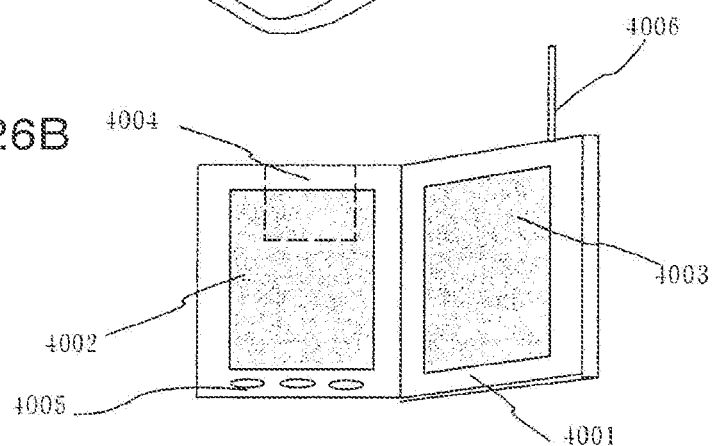

FIG. 26B shows a mobile book (electronic book) which includes a main body 4001, display portions 4002 and 4003, a storage medium 4004, operating switches 4005, an antenna 4006 and the like. The invention can be applied to the display portions 4002 and 4003.

Figure 26C:
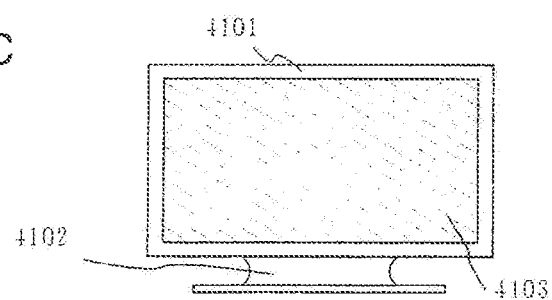
Figure 27A:
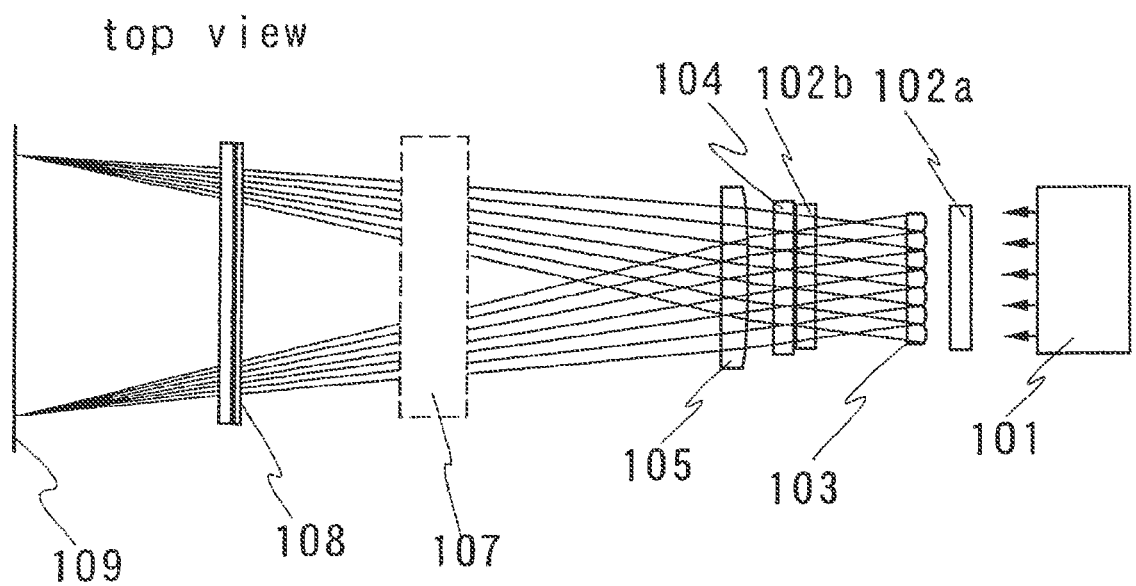
FIGS. 27A and 27B are a top view and a side view showing an example of a conventional optical system.
Figure 27B:
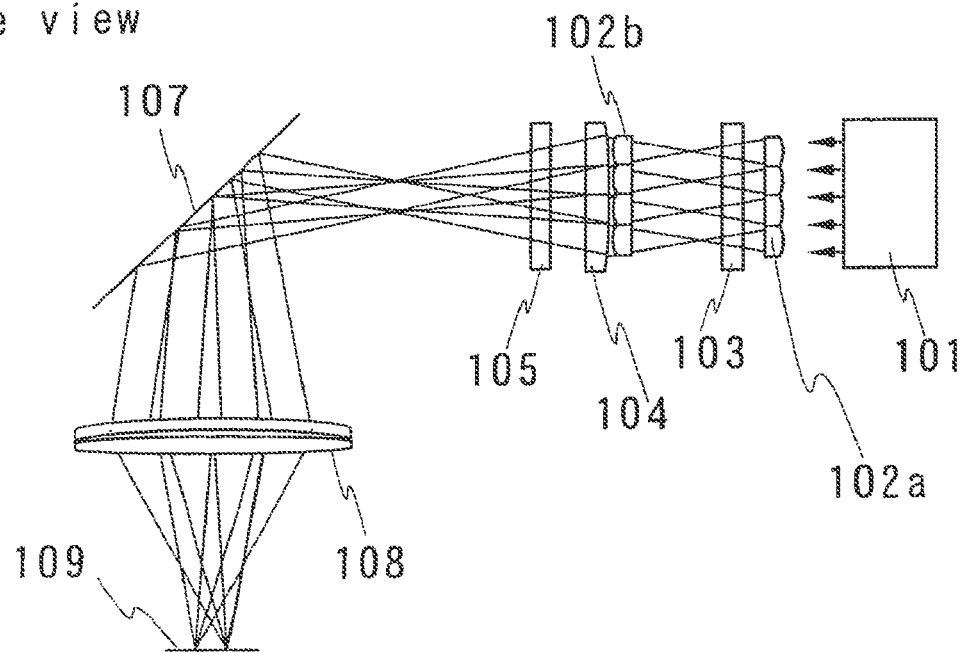
Figure 28:
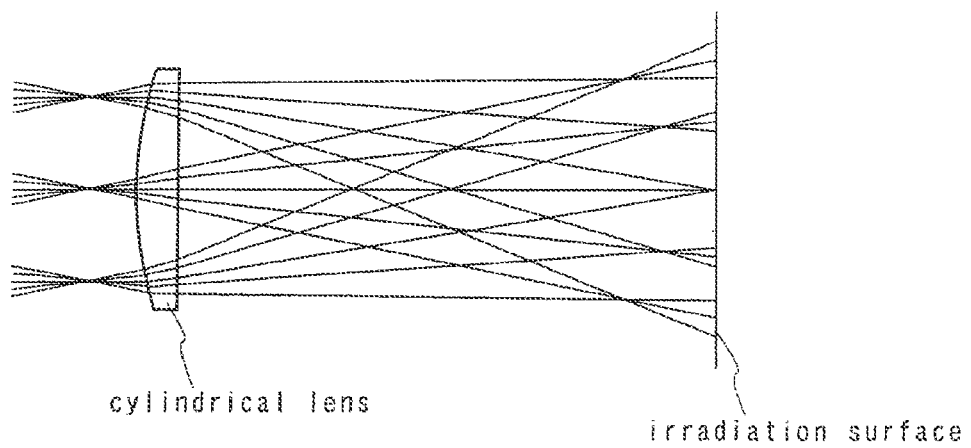
FIG. 28 shows an example of forming curvature of field.

FIG. 26C shows a display which includes a main body 4101, a support base 4102, a display portion 4103 and the like. The invention can be applied to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 7 and 8.

By adopting the structures of the present invention, fundamental significance can be obtained as follows.

(a) It is possible to form the laser beam having the uniform energy distribution on the irradiation surface (including the plane in the vicinity thereof). Further, it is possible to form the laser beam which has the uniform energy distribution on the irradiation surface (including the plane in the vicinity thereof) and is longer than the prior art in the length direction. This is particularly effective in the case of the large area substrate.

(b) It is possible to improve the throughput.

(c) It is possible to provide the optical system having the uniform energy distribution on the irradiation surface (including the plane in the vicinity thereof) and the short optical path length. Accordingly, optical adjustment is easily performed and the footprint can be reduced, thereby realizing the smaller size apparatus. Further, even if the apparatus is installed in a clean room which is extremely high in cost per unit area, it is possible to suppress the cost.

(d) When the above-described advantages are satisfied, in the semiconductor device represented by the active matrix liquid crystal display device, it can be realized to improve the operational characteristics and reliability of the semiconductor device. In addition, it can be realized to reduce the manufacturing cost of the semiconductor device.

What is claimed is:

1. A laser irradiation apparatus, comprising:
   a laser;
   a first cylindrical lens array for dividing a laser beam emitted from the laser into a plurality of laser beams in a first direction perpendicular to an optical axis of the laser beam;
   a cylindrical lens for superposing into one the plurality of laser beams which are divided in the first direction;
   a second cylindrical lens array for dividing the laser beam into a plurality of laser beams in a second direction perpendicular to both the optical axis and the first direction; and
   a toroidal lens or a crossed cylindrical lens for setting a convergent position of the laser beam superposed in the first direction on an irradiation surface and superposing into one the plurality of laser beams which are divided in the second direction on the irradiation surface.

2. A laser irradiation apparatus according to claim 1, wherein the laser is a solid laser or gas laser of a continuous oscillation type or pulse oscillation type.

3. A laser irradiation apparatus according to claim 1, wherein the laser is one selected from the group consisting of a continuous oscillation or pulse oscillation YAG laser, $YVO_4$ laser, YLF laser, $YAlO_3$ laser, glass laser, ruby laser, alexandrite laser, and Ti:sapphire laser.

4. A laser irradiation apparatus according to claim 1, wherein the laser is one selected from the group consisting of a continuous oscillation or pulse oscillation excimer laser, Ar laser and Kr laser.

5. A laser irradiation apparatus according to claim 1, wherein the laser beam is converted into a harmonic by a non-linear optical element.

6. A laser irradiation apparatus according to claim 1, wherein the laser beam is one selected from the group consisting of a continuous oscillation or pulse oscillation excimer laser, Ar laser and Kr laser.

7. An optical system for a laser irradaition, comprising:
   a first cylindrical lens array for dividing a laser beam emitted from a laser into a plurality of laser beams in a first direction perpendicular to an optical axis of the laser beam;
   a cylindrical lens for superposing into one the plurality of laser beams which are divided in the first direction;
   a second cylindrical lens array for dividing the laser beam into a plurality of laser beams in a second direction perpendicular to both the optical axis and the first direction; and
   a toroidal lens or a crossed cylindrical lens for setting a convergent position of the laser beam superposed in the first direction on an irradiation surface and superposing into one the plurality of laser beams which are divided in the second direction on the irradiation surface.

8. An optical system according to claim 7, wherein the laser is a solid laser or gas laser of a continuous oscillation type or pulse oscillation type.

9. An optical system according to claim 7, wherein the laser is one selected from the group consisting of a continuous oscillation or pulse oscillation YAG laser, $YVO_4$ laser, YLF laser, $YAlO_3$ laser, glass laser, ruby laser, alexandrite laser, and Ti:sapphire laser.

10. An optical system according to claim 7, wherein the laser is one selected from the group consisting of a continuous oscillation or pulse oscillation excimer laser, Ar laser and Kr laser.

11. An optical system according to claim 7, wherein the laser beam is converted into a harmonic by a non-linear optical element.

12. An optical system according to claim 7, wherein the laser beam is one selected from the group consisting of a continuous oscillation or pulse oscillation excimer laser, Ar laser and Kr laser.

* * * * *